(12) United States Patent
Moseson et al.

(10) Patent No.: US 11,024,270 B2
(45) Date of Patent: Jun. 1, 2021

(54) GUITAR-LIKE DIGITAL MUSICAL INSTRUMENT

(71) Applicants: Stephen Moseson, Bloomington, IN (US); Michael Zarimis, Sydney (AU)

(72) Inventors: Stephen Moseson, Bloomington, IN (US); Michael Zarimis, Sydney (AU)

(*) Notice: Subject to any disclaimer, the term of this patent is extended or adjusted under 35 U.S.C. 154(b) by 0 days.

(21) Appl. No.: 16/258,302

(22) Filed: Jan. 25, 2019

(65) Prior Publication Data
US 2020/0243049 A1 Jul. 30, 2020

(51) Int. Cl.
  *G10D 1/08* (2006.01)
  *G10D 3/06* (2020.01)
  *H05K 1/02* (2006.01)

(52) U.S. Cl.
  CPC ............. *G10D 1/085* (2013.01); *G10D 3/06* (2013.01); *H05K 1/0213* (2013.01)

(58) Field of Classification Search
  CPC ......... G10D 1/085; G10D 3/06; H05K 1/0213
  See application file for complete search history.

(56) References Cited

U.S. PATENT DOCUMENTS

| | | | |
|---|---|---|---|
| 102,240 A | 4/1870 | Fish | |
| 417,770 A | 12/1889 | Collom | |
| 497,448 A | 5/1893 | Hoyt | |
| 5,739,455 A | 4/1998 | Poon | |
| 5,900,561 A * | 5/1999 | Wechter | G10D 1/08 84/267 |
| 6,028,255 A * | 2/2000 | Myronyk | G10D 3/06 84/290 |
| 9,245,505 B1 * | 1/2016 | Feng | G10H 1/02 |
| 2004/0244566 A1 | 12/2004 | Steiger | |
| 2011/0088535 A1 * | 4/2011 | Zarimis | G10H 1/0066 84/645 |
| 2014/0144306 A1 * | 5/2014 | Seal | G10D 1/005 84/291 |

FOREIGN PATENT DOCUMENTS

WO   WO 2009/111815 A9   9/2009

OTHER PUBLICATIONS

Misa Digital, kitara, Jan. 1, 2011, 12 pages in total, https://misa-digital.myshopify.com/products/kitara.
Misa Digital, Tri-bass, Jul. 30, 2013, 5 pages in total, https://misa-digital.myshopify.com/products/tri-bass.
Misa Digital, Misa Tri-bass Manual, Mar. 18, 2014, 2 pages in total, https://misa-digital.myshopify.com/pages/tri-bass-documentation.
New Atlas, Kitara gets axed, replaced by the Misa tri-bass, Aug. 12, 2013, 5 pages in total, https://newatlas.com/misa-digital-tri-bass/28662/.
TechHive, Misa Digital Guitar Makes Your Rock Band Peripherals Feel Inadequate, Jan. 20, 2010, 4 pages in total, https://www.techhive.com/article/187331/misa_digital_guitar.html.
Misa Digital, Misa Digital Kitara Demo, Jan. 17, 2010, 3 pages in total, https://www.youtube.com/watch?v=xs6jzjIrBVc.

* cited by examiner

*Primary Examiner* — Kimberly R Lockett
(74) *Attorney, Agent, or Firm* — Indiana University Maurer School of Law Intellectual Property Legal Clinic

(57) ABSTRACT

The present embodiments relate to a digital music instrument that allows musicians to play and control synthesizers. An instrument neck assembly is provided with adjustable buttons. The neck assembly is attached to an instrument body with an attachment mechanism.

19 Claims, 57 Drawing Sheets

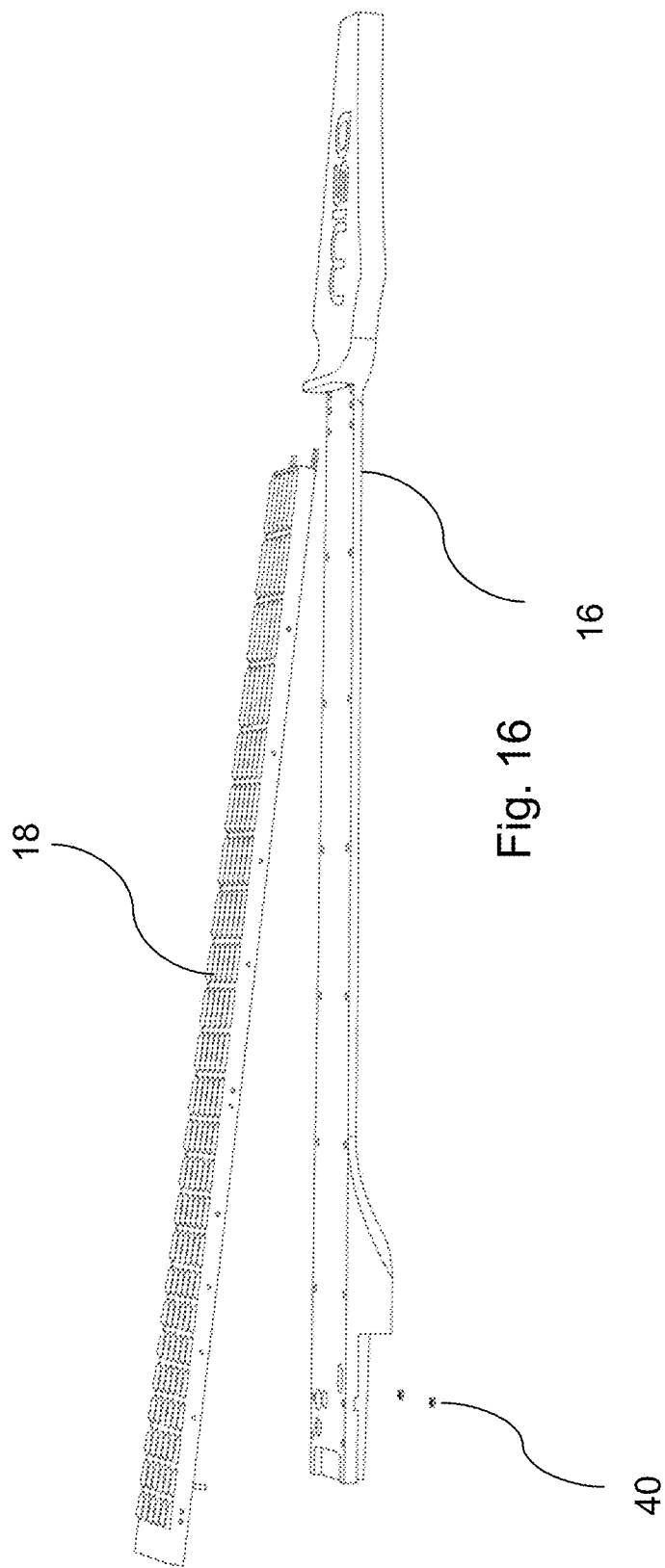

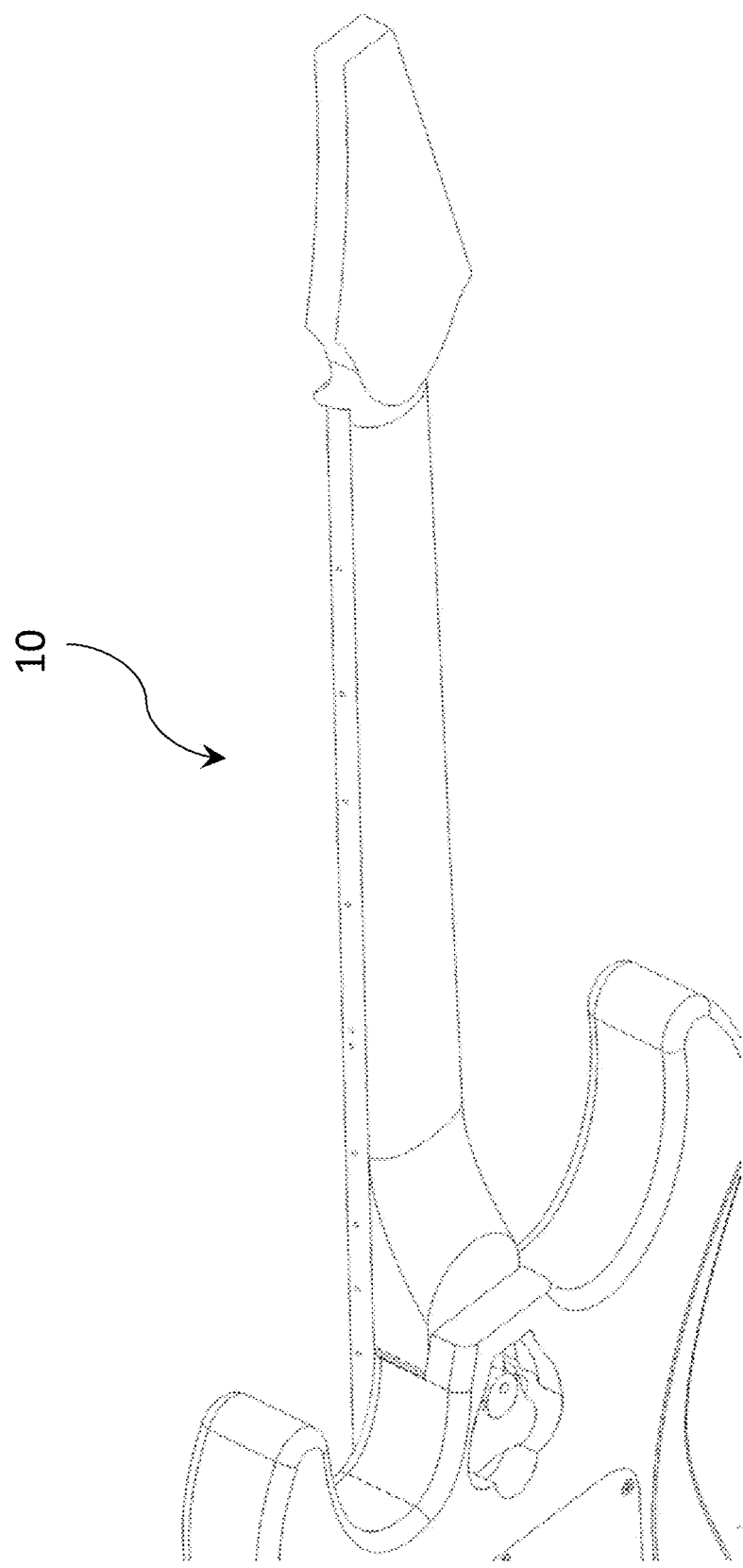

GUITAR-LIKE DIGITAL MUSICAL INSTRUMENT

FIELD OF DISCLOSURE

The present disclosure relates to a digital music instrument that allows musicians to play the instrument and control a synthesizer.

BACKGROUND AND SUMMARY OF THE DISCLOSURE

Additional features of the present disclosure will become apparent to those having skill in the art upon consideration of the following detailed description of the illustrative embodiment exemplifying the best mode of carrying out the disclosure as presently perceived.

According to the present disclosure, a digital musical instrument is provided. The instrument includes a body, a recessed touchscreen supported by the body, a neck extending from the body, and a plurality of buttons supported by the neck. When playing the instrument, musicians are able to switch among various sounds by contacting the touch screen with one or more fingers.

According to another aspect of the present disclosure, portions of the neck are adjustable to allow adjustment of the feel of the buttons according to a musician's preference. According to another aspect of the present disclosure, the neck is attached to the body without having exposed fasteners. According to another aspect of the present disclosure, the neck is removable from the body.

BRIEF DESCRIPTION OF THE DRAWINGS

The aforementioned aspects and many of the intended features of this invention will grow to be appreciated at a greater level once references to the following accompanying illustrations are expounded upon.

FIG. 16 is a perspective exploded view of the neck box attached to the neck body.

FIG. 32I is a partial bottom perspective view of the instrument.

Figure 1:
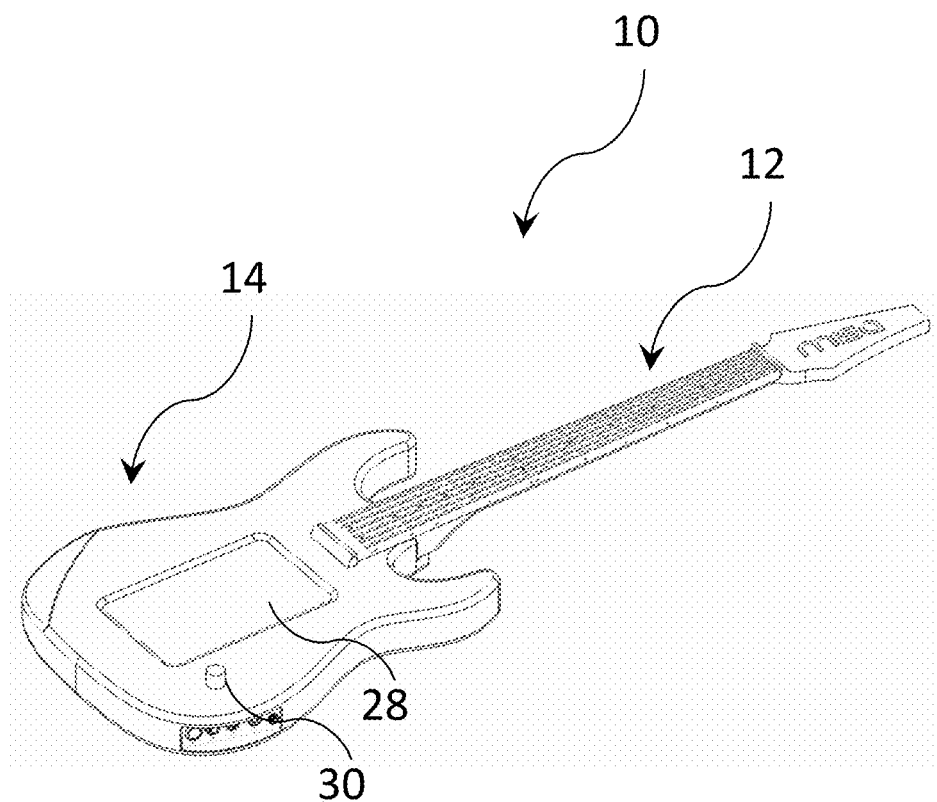
FIG. 1 is a perspective view of a digital instrument including an instrument body and a neck assembly coupled to the instrument body.

Equivalent reference components point to corresponding parts throughout the several views. Unless otherwise indicated, the components shown in the drawings are proportional to each other. Wherein, the illustrations depicted are manifestations of the disclosure, and such illustrations shall in no way be interpreted as limiting the scope of the disclosure. For the purposes of promoting and understanding of the principles of the disclosure, reference will now be made to the embodiments illustrated in the drawings, which are described below. The embodiments disclosed below are not intended to be exhaustive or limit the disclosure to the precise form disclosed in the following detailed description. Rather, the embodiments are chosen and described so that others skilled in the art may utilize their teachings. It will be understood that no limitation of the scope of the disclosure is thereby intended. The disclosure includes any alterations and further modifications in the illustrative devices and described methods and further applications of the principles of the disclosure which would normally occur to one skilled in the art to which the disclosure relates.

DETAILED DESCRIPTION OF THE DRAWINGS

Figure 3:
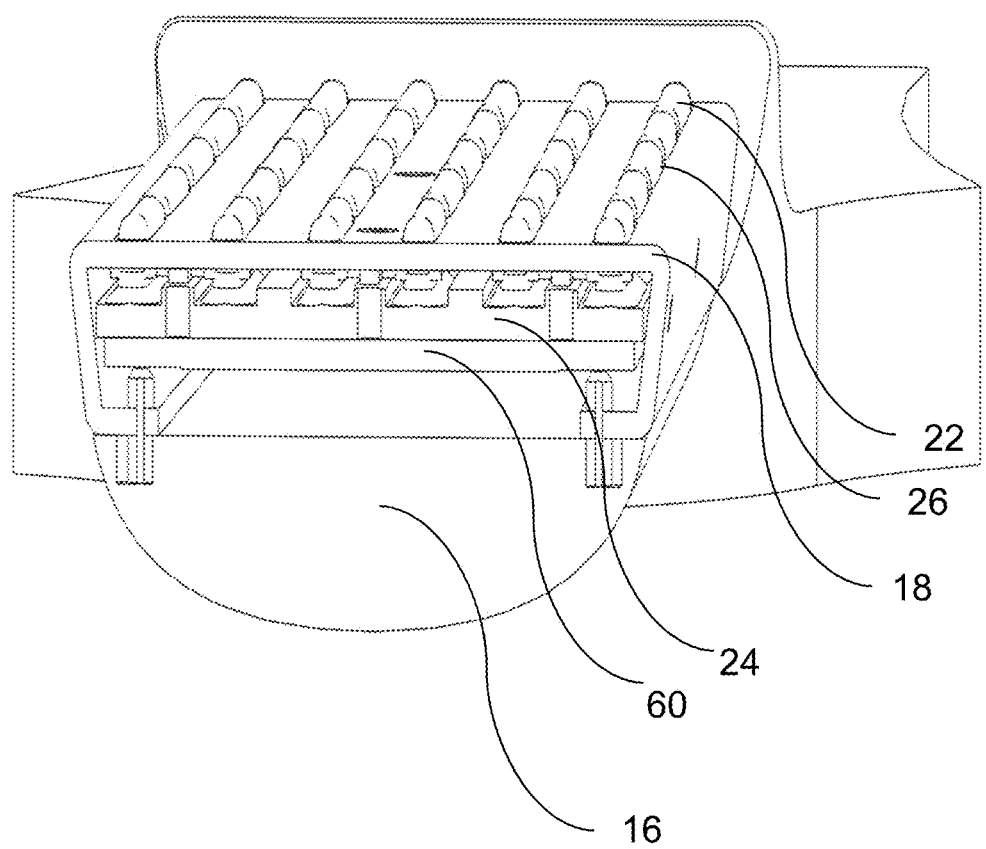
FIG. 3 is a cross-sectional perspective view of the neck assembly.
Figure 4:
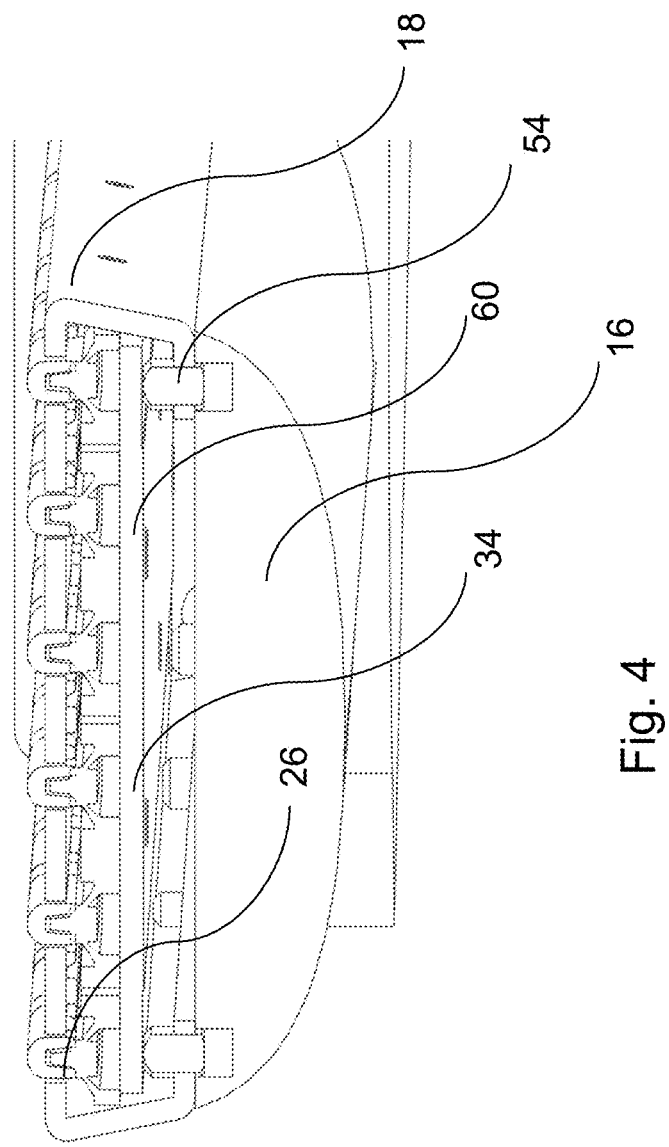
FIG. 4 is a cross-sectional perspective view of the neck assembly.
Figure 5:
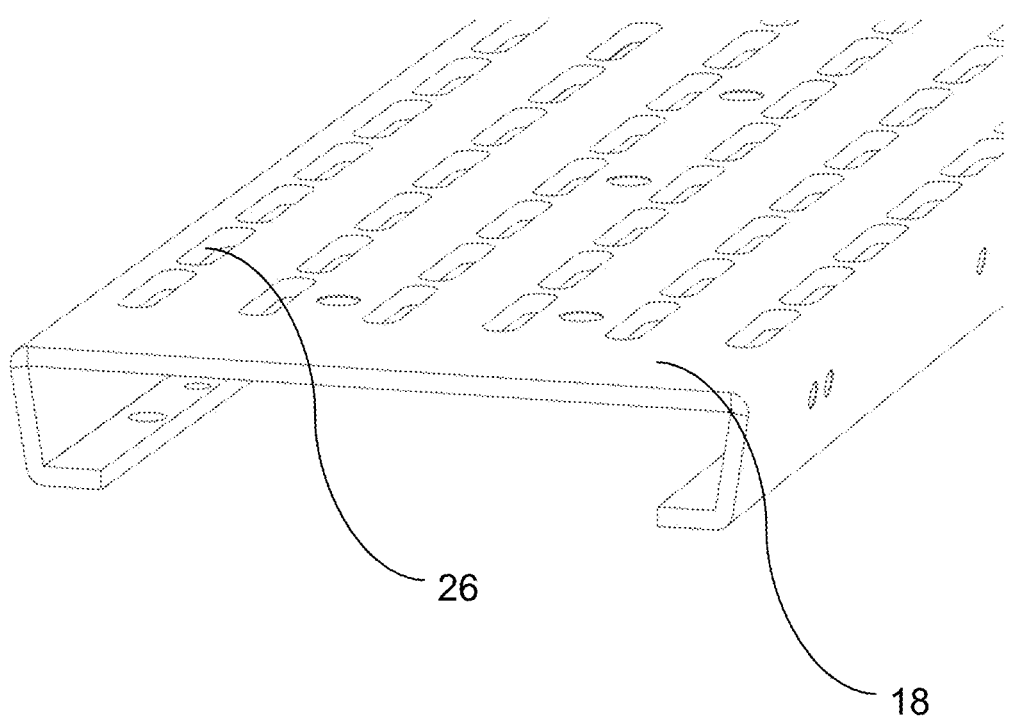
FIG. 5 is a partial perspective view of a bottom end of the neck box.
Figure 6:
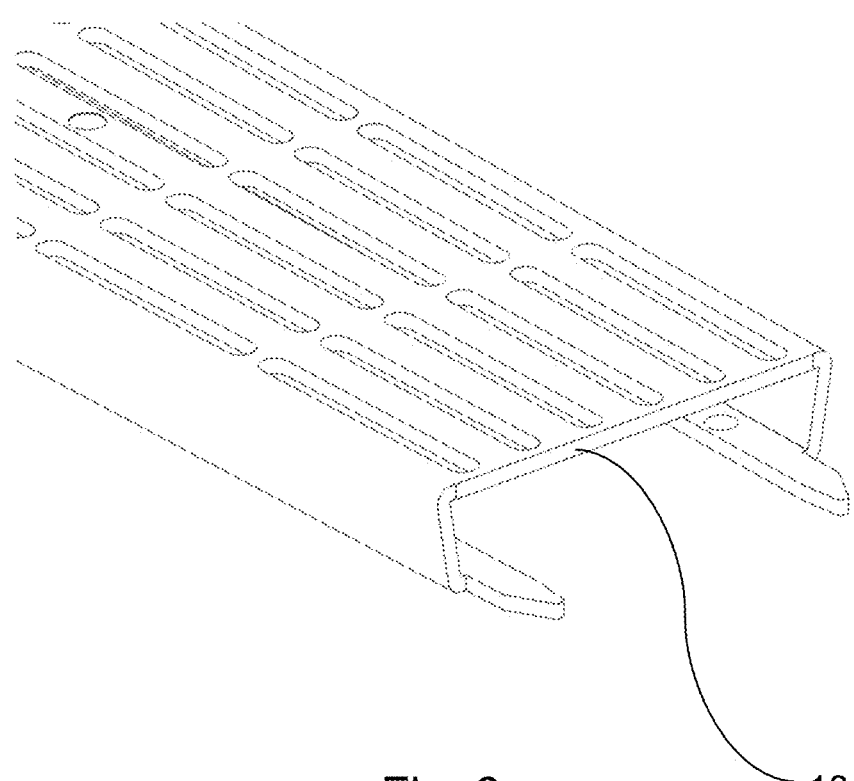
FIG. 6 is a partial perspective view of a top end of the neck box.
Figure 7:
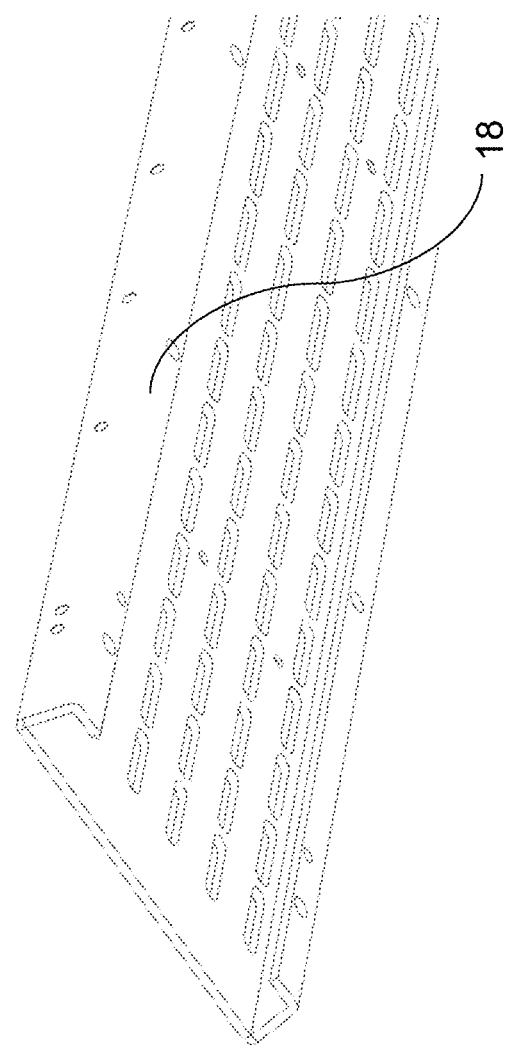
FIG. 7 is a partial bottom perspective view of the neck box.
Figure 8:
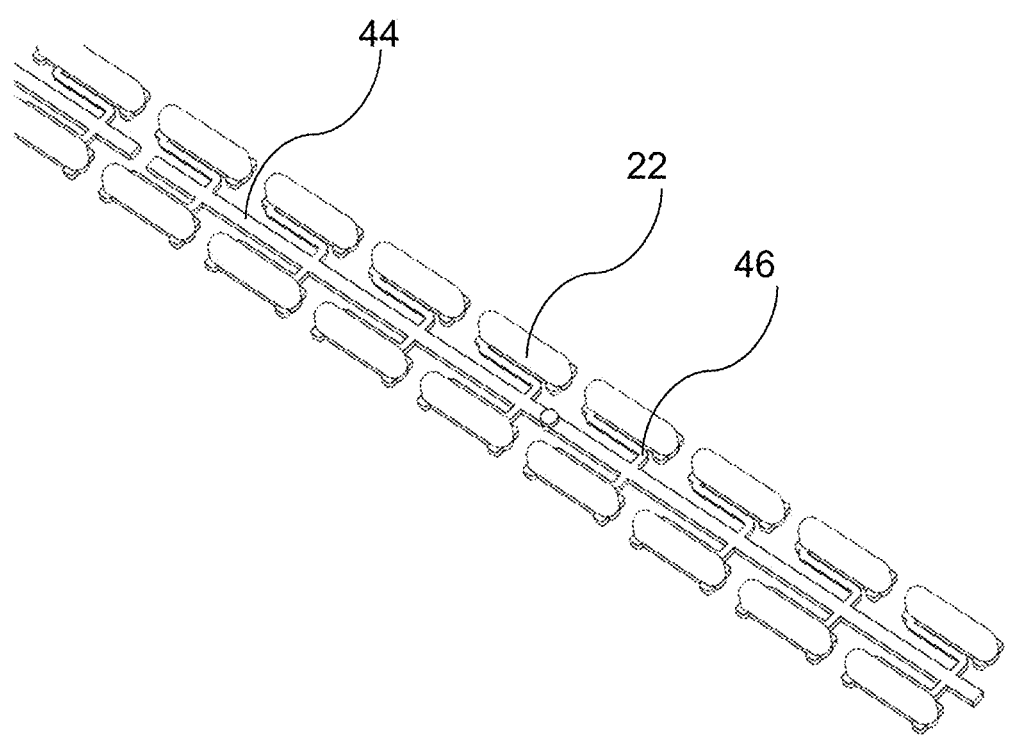
FIG. 8 is a partial top perspective view of the plurality of buttons.
Figure 9:
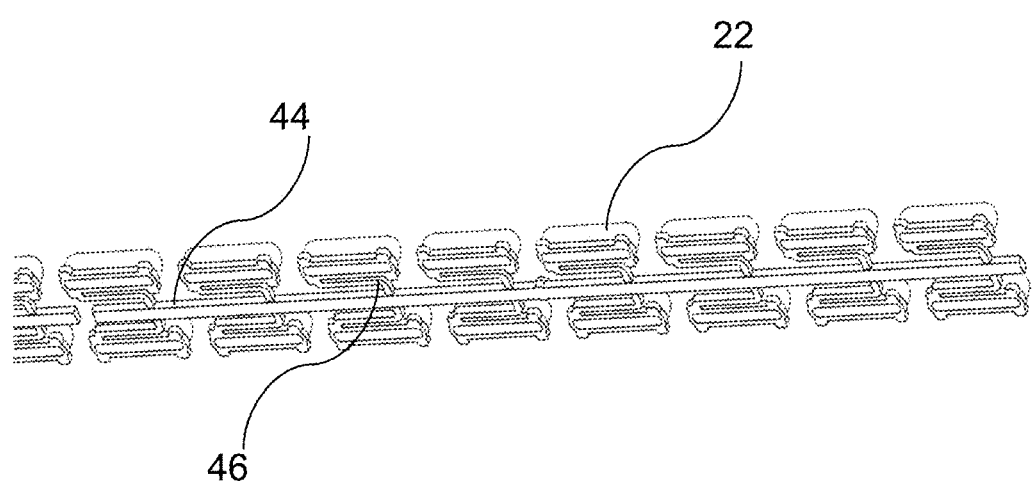
FIG. 9 is a partial bottom perspective view of the plurality of buttons.
Figure 10:
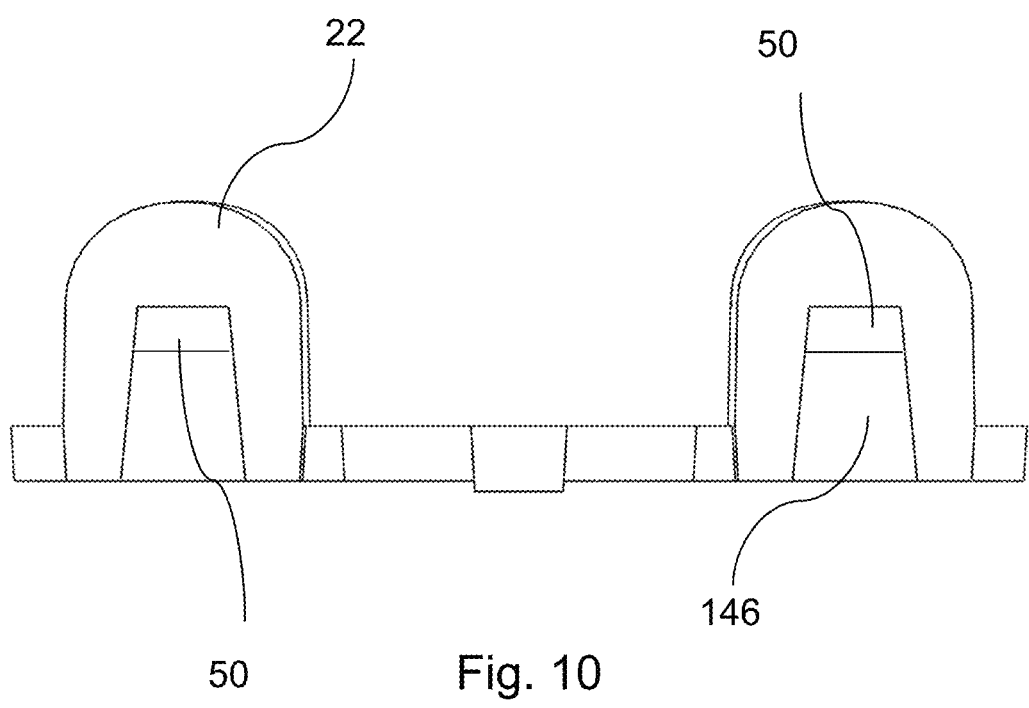
FIG. 10 is a cross-sectional view of the plurality of buttons.
Figure 11:
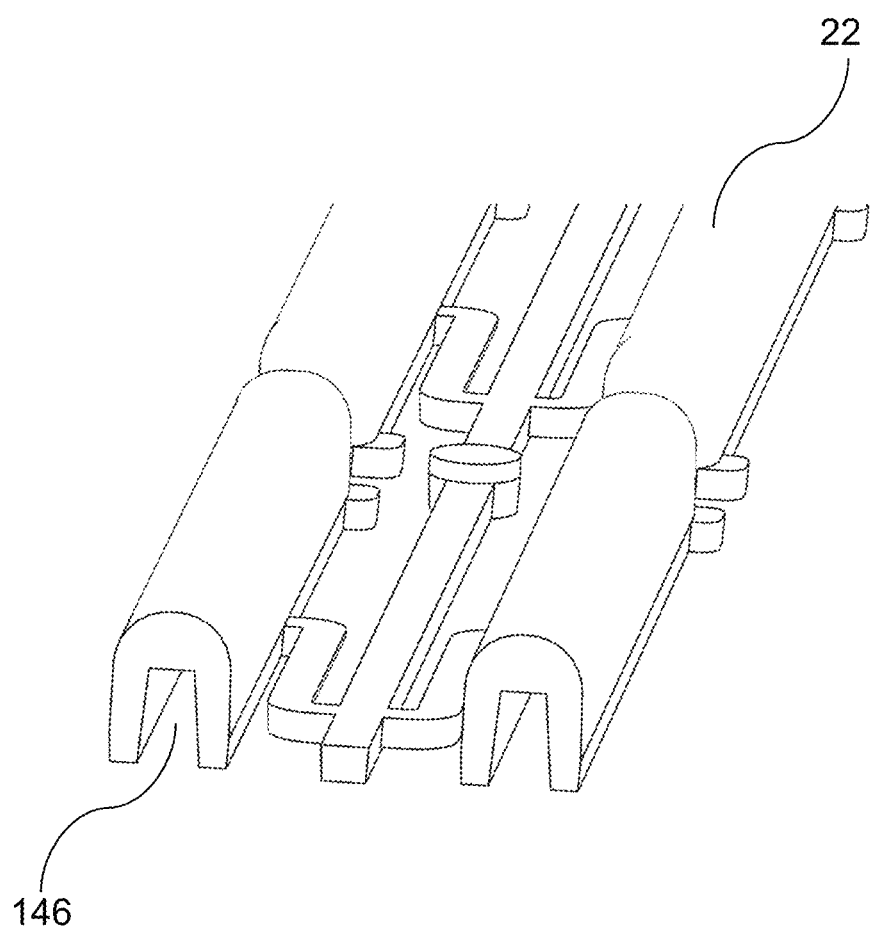
FIG. 11 is a partial top perspective view of the buttons.
Figure 12:
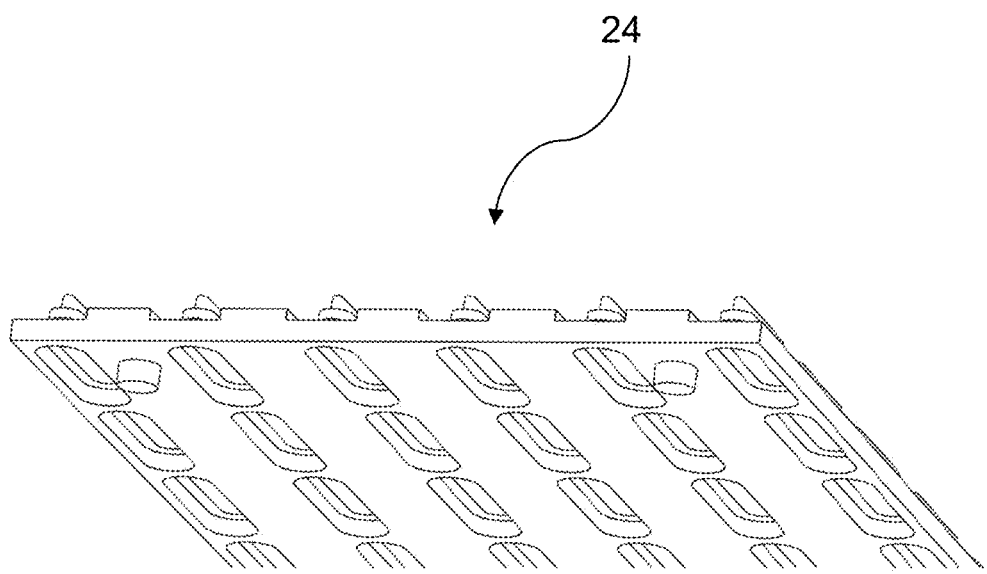
FIG. 12 is a partial bottom perspective view of the flexible film.

As shown in FIG. 1, an instrument 10 according to the present disclosure includes a neck assembly 12 and an instrument body 14 connected to neck assembly 12. Neck assembly 12 includes a neck body 16, a neck box 18 connected to neck body 16, and headstock 20 connected to neck body 16 at the end opposite to instrument body 14. Neck box 18 houses a plurality of buttons 22, a flexible film 24, and a circuit board assembly 34. As shown in FIGS. 3 and 4, at least a part of buttons 22 protrude out of the top surface of neck box 18 through a plurality of holes 26 to provide areas that an operator can push to mimic the pressing on the strings of a traditional guitar (not shown). Neck box 18 can be made of metal, plastic or other materials. Flexible film 24 can be a silicon film that provides sufficient force to push buttons 22 up toward neck box 18 and keep buttons 22 raised off of neck box 18 when a user is not pressing on buttons 22.

Figure 31A:
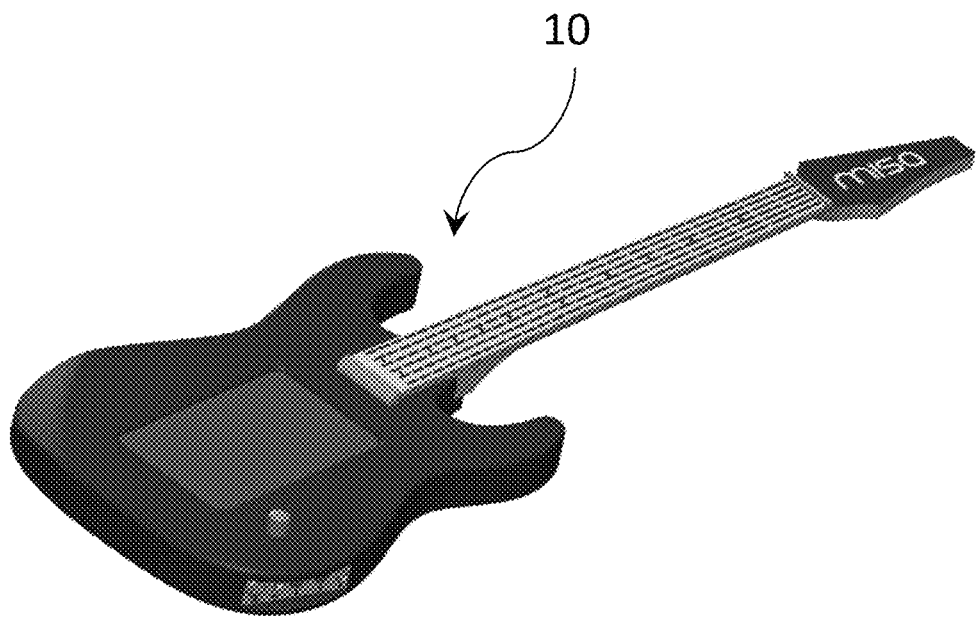
FIG. 31A is a top perspective view of the instrument.
Figure 31B:
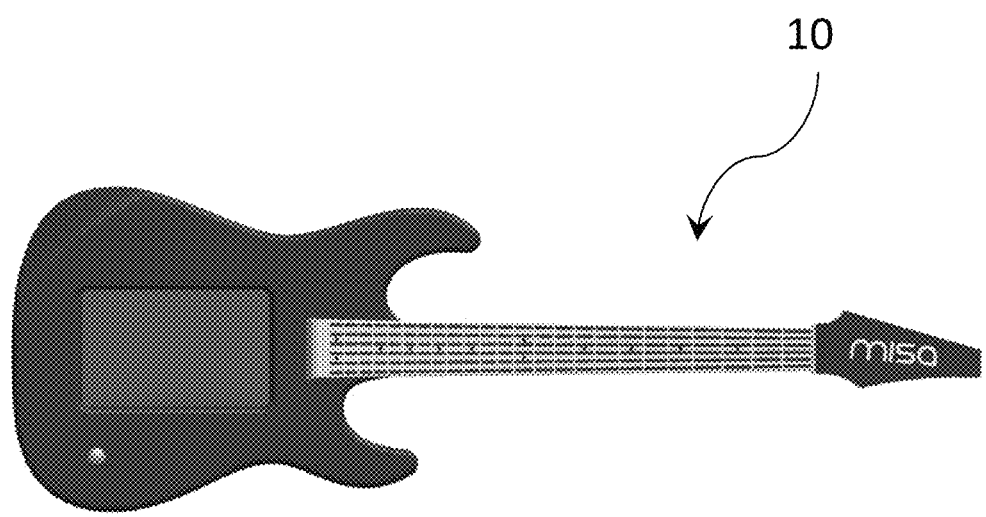
FIG. 31B is a top view of the instrument.
Figure 31C:
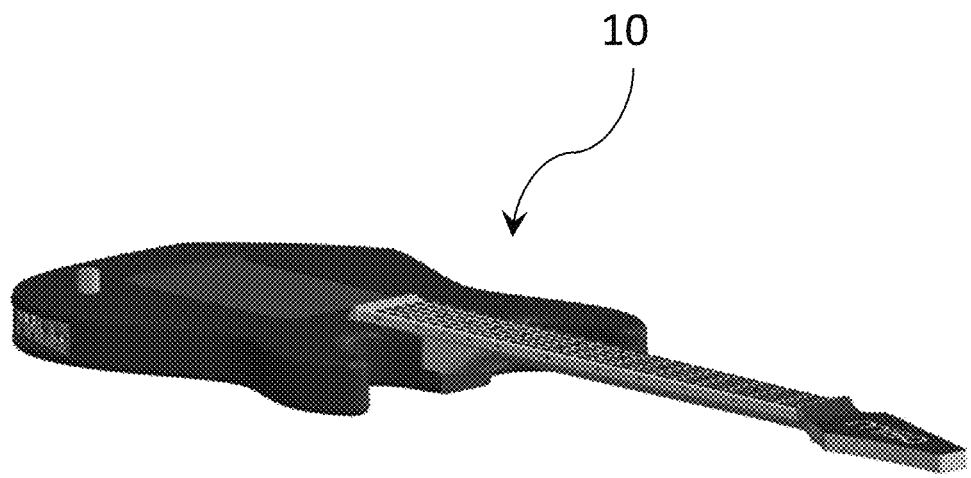
FIG. 31C is an end perspective view of the instrument.
Figure 31D:
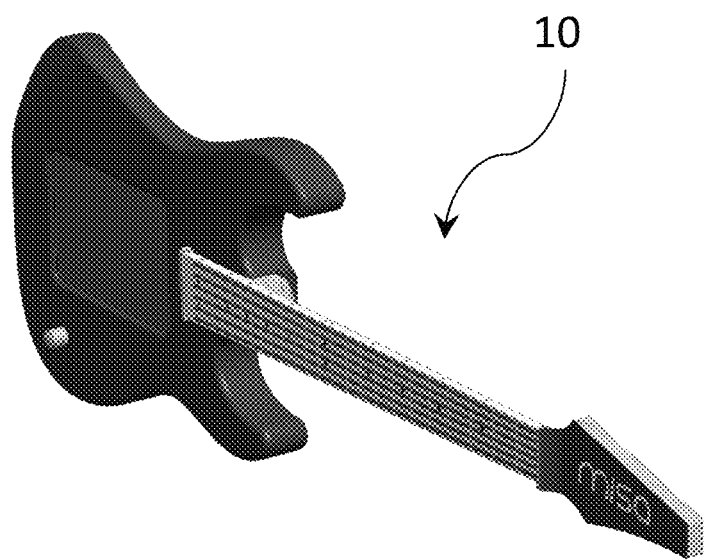
FIG. 31D is an end perspective view of the instrument.
Figure 31E:
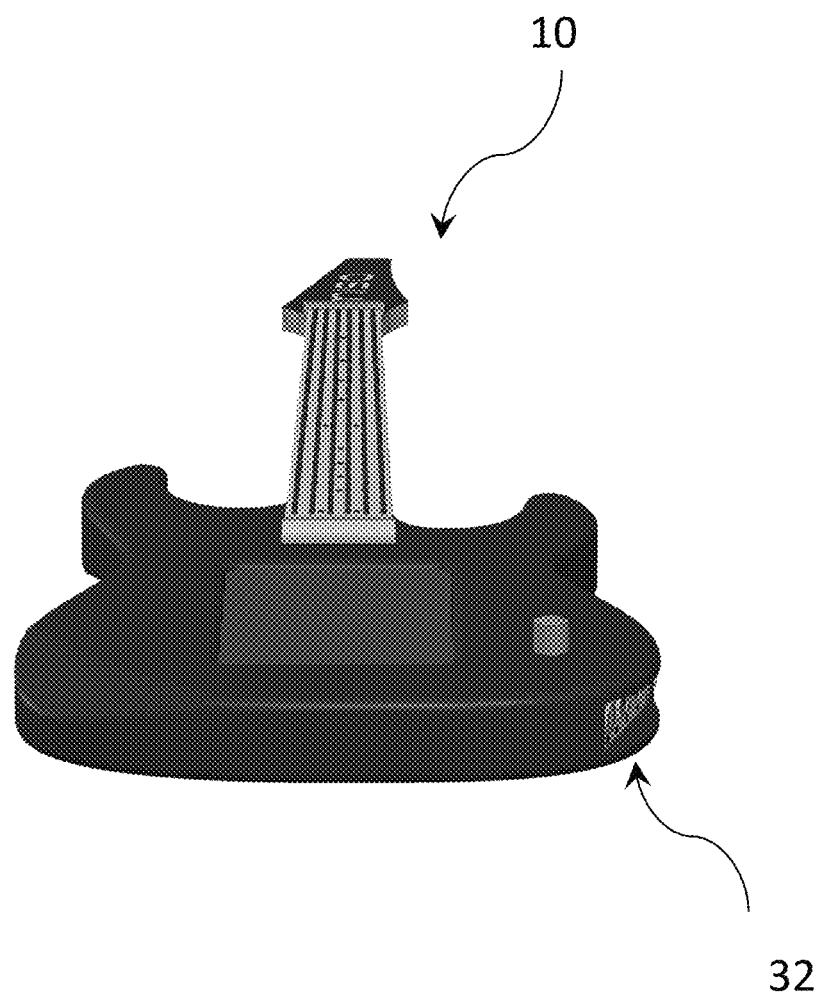
FIG. 31E is an end perspective view of the instrument.
Figure 31F:
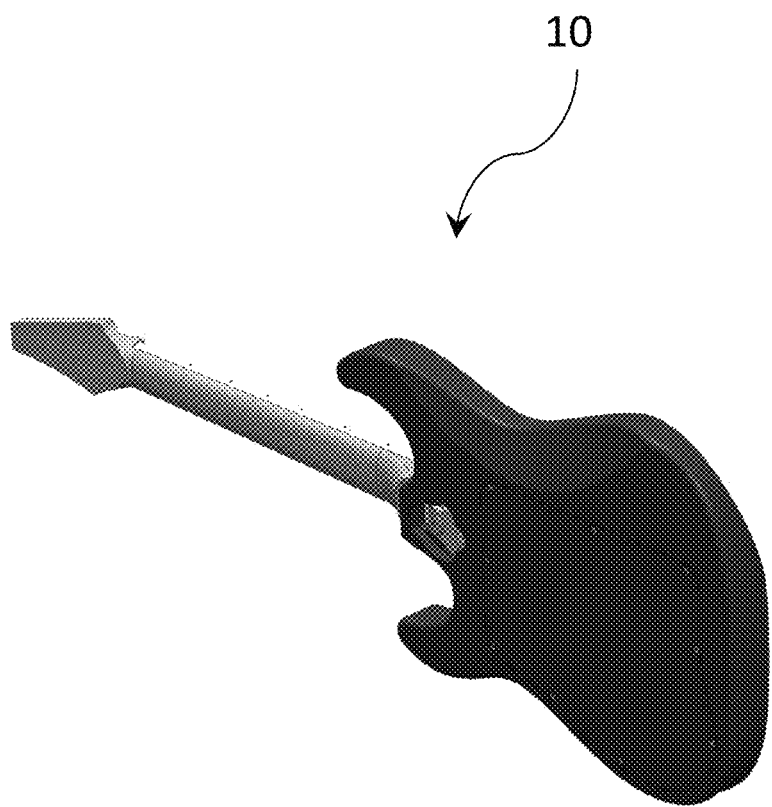
FIG. 31F is a back perspective view of the instrument.
Figure 31G:
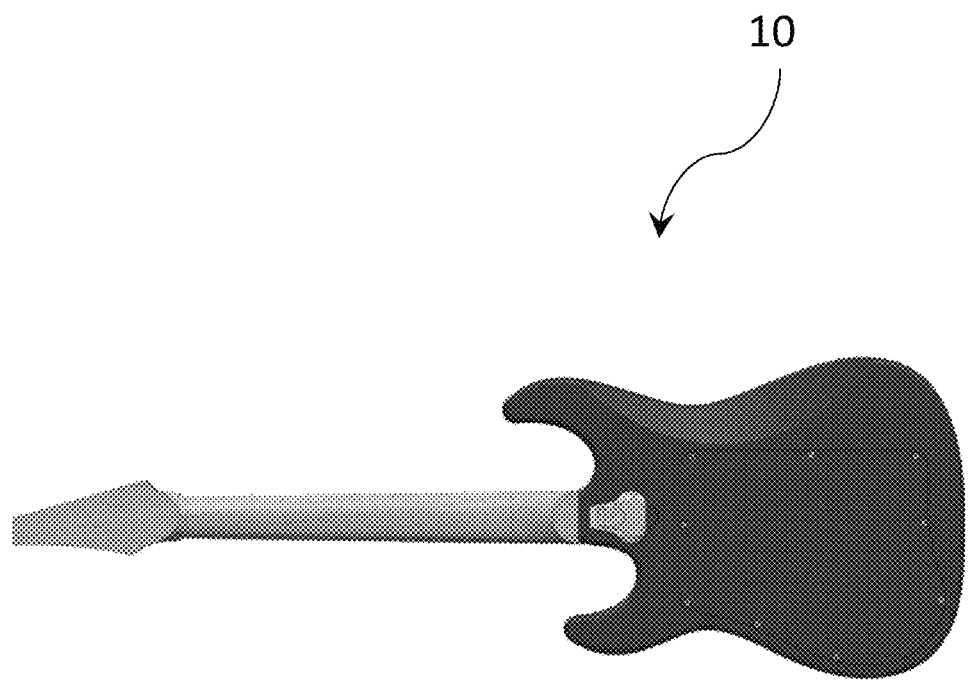
FIG. 31G is bottom view of the instrument.
Figure 31H:
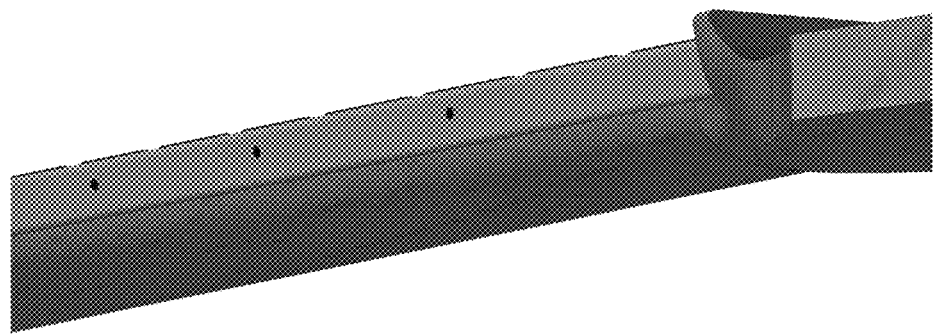
FIG. 31H is a partial perspective view of the neck assembly.
Figure 31I:
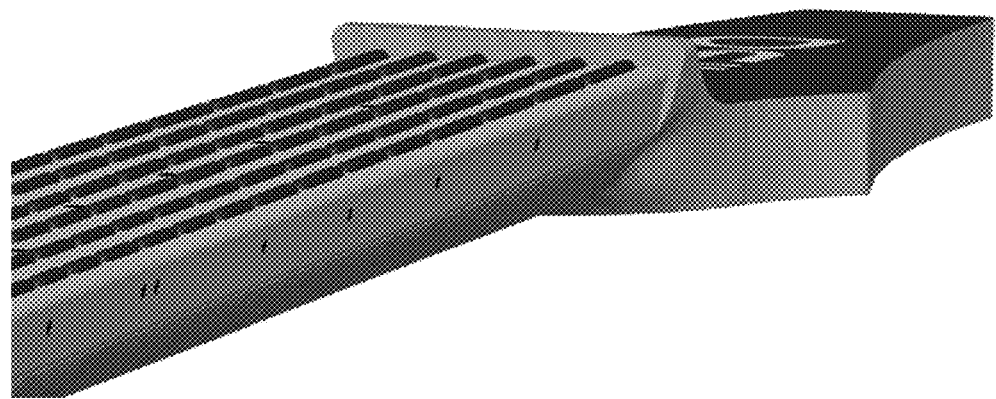
FIG. 31I is a partial perspective view of the neck assembly.
Figure 31J:
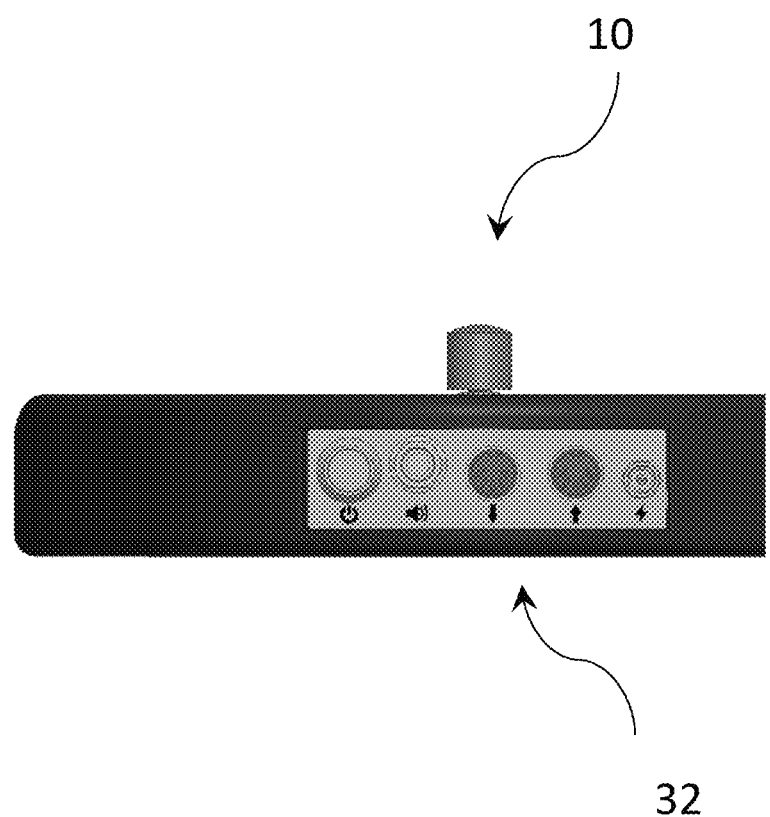
FIG. 31J is a partial perspective of the instrument showing ports.
Figure 32A:
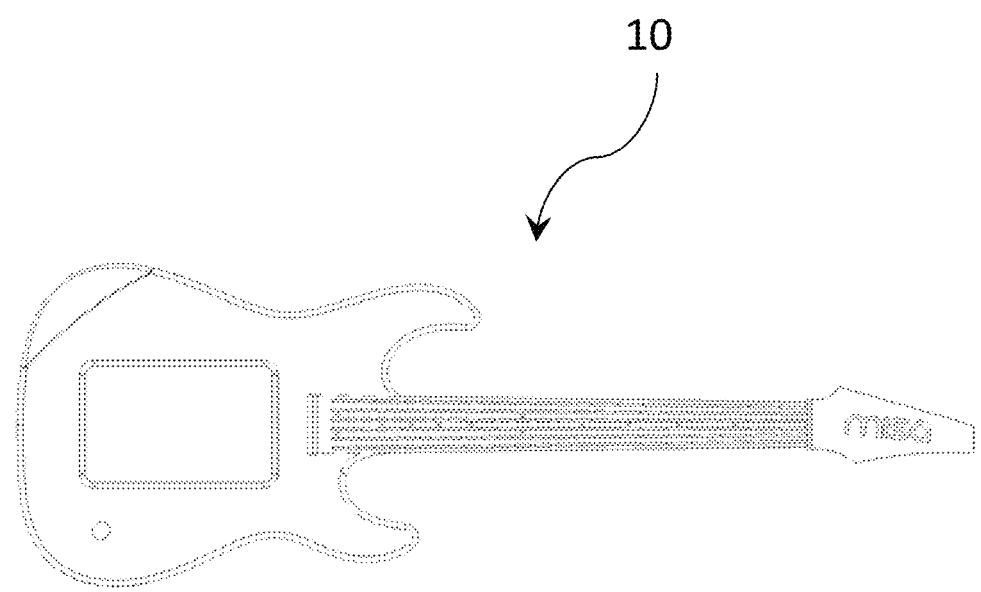
FIG. 32A is a top view of the instrument.
Figure 32B:
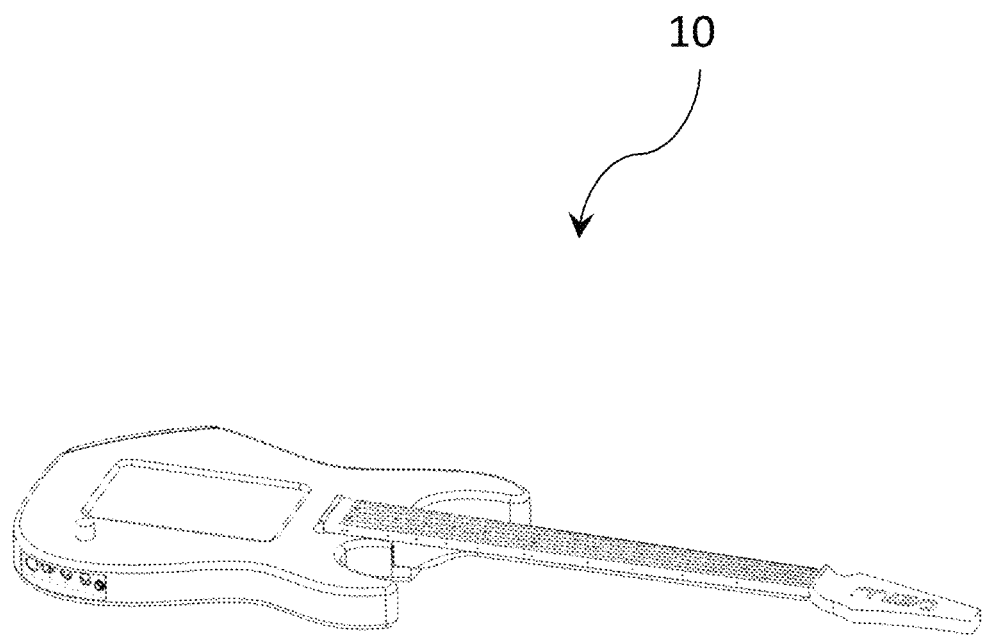
FIG. 32B is a top perspective view of the instrument.
Figure 32C:
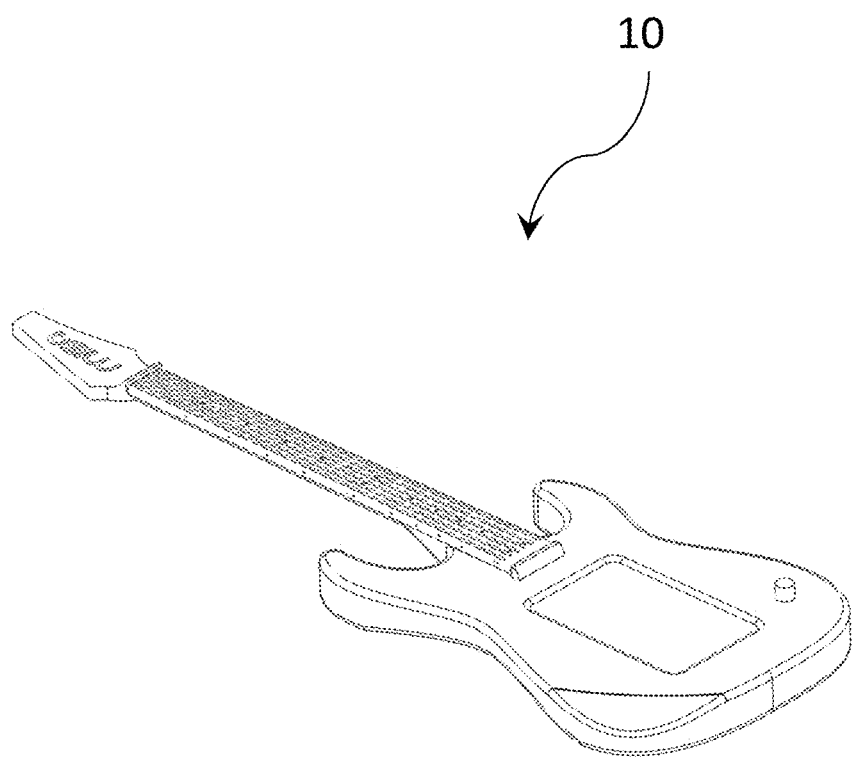
FIG. 32C is a top perspective view of the instrument.
Figure 32D:
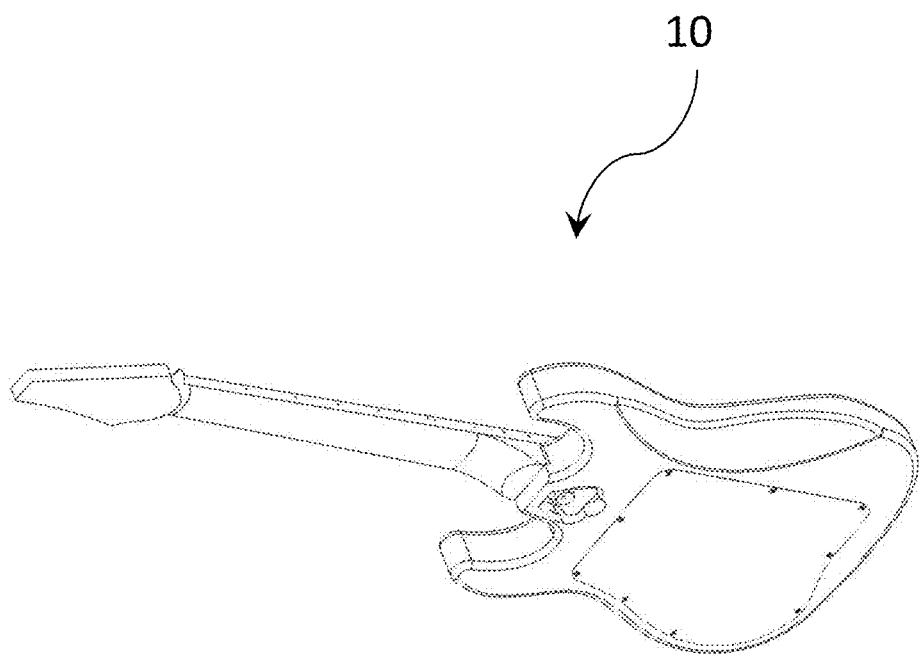
FIG. 32D is a bottom perspective view of the instrument.
Figure 32E:
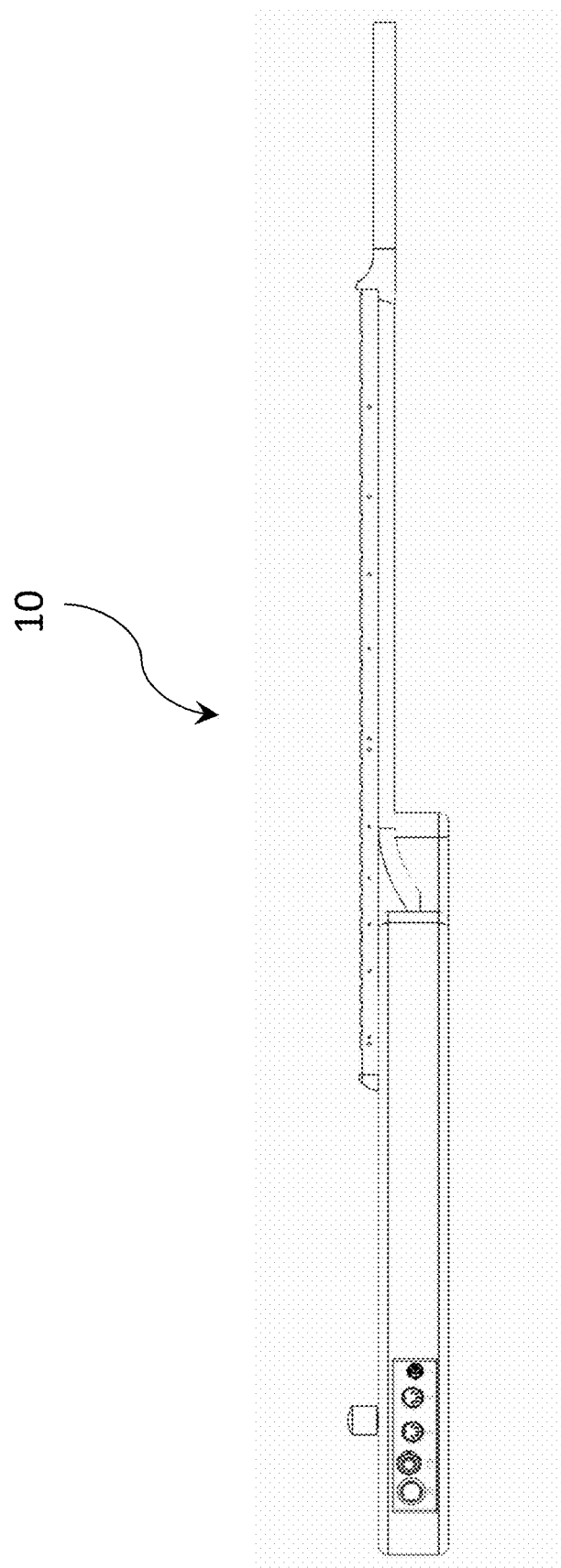
FIG. 32E is a side view of the instrument.
Figure 32F:
FIG. 32F is a side view of the instrument.
Figure 32G:
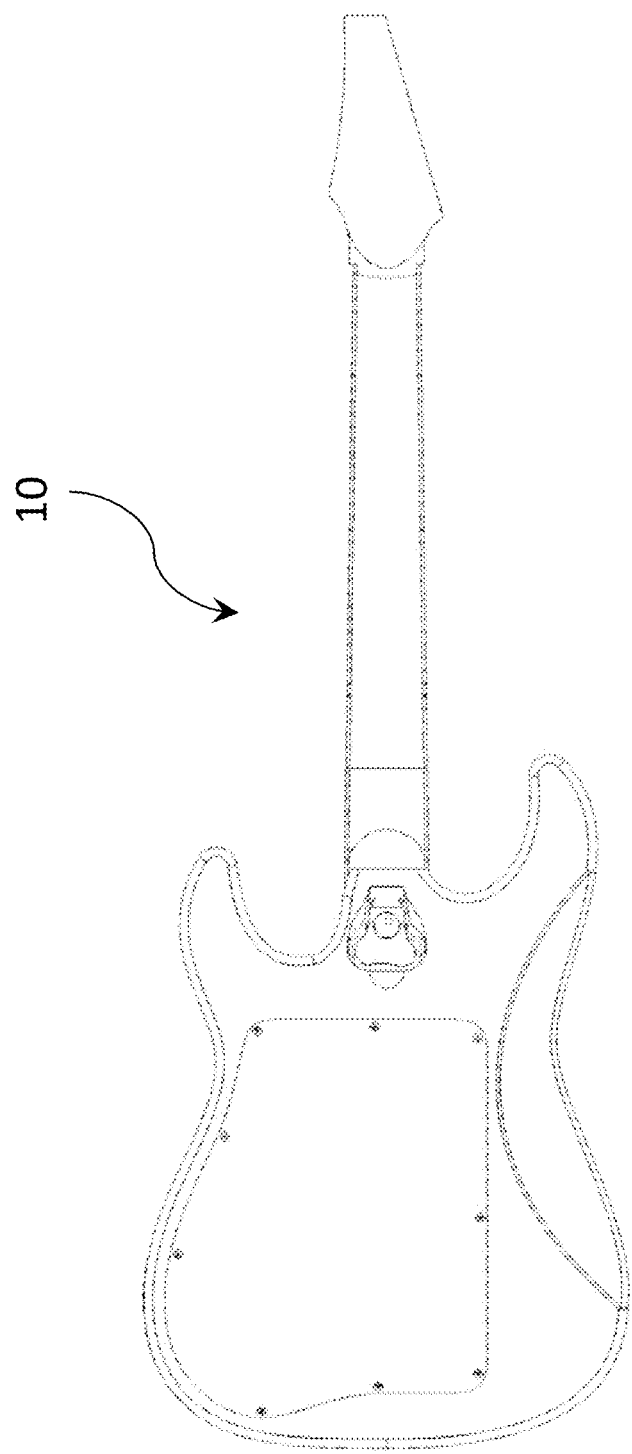
FIG. 32G is a bottom view of the instrument.
Figure 32H:
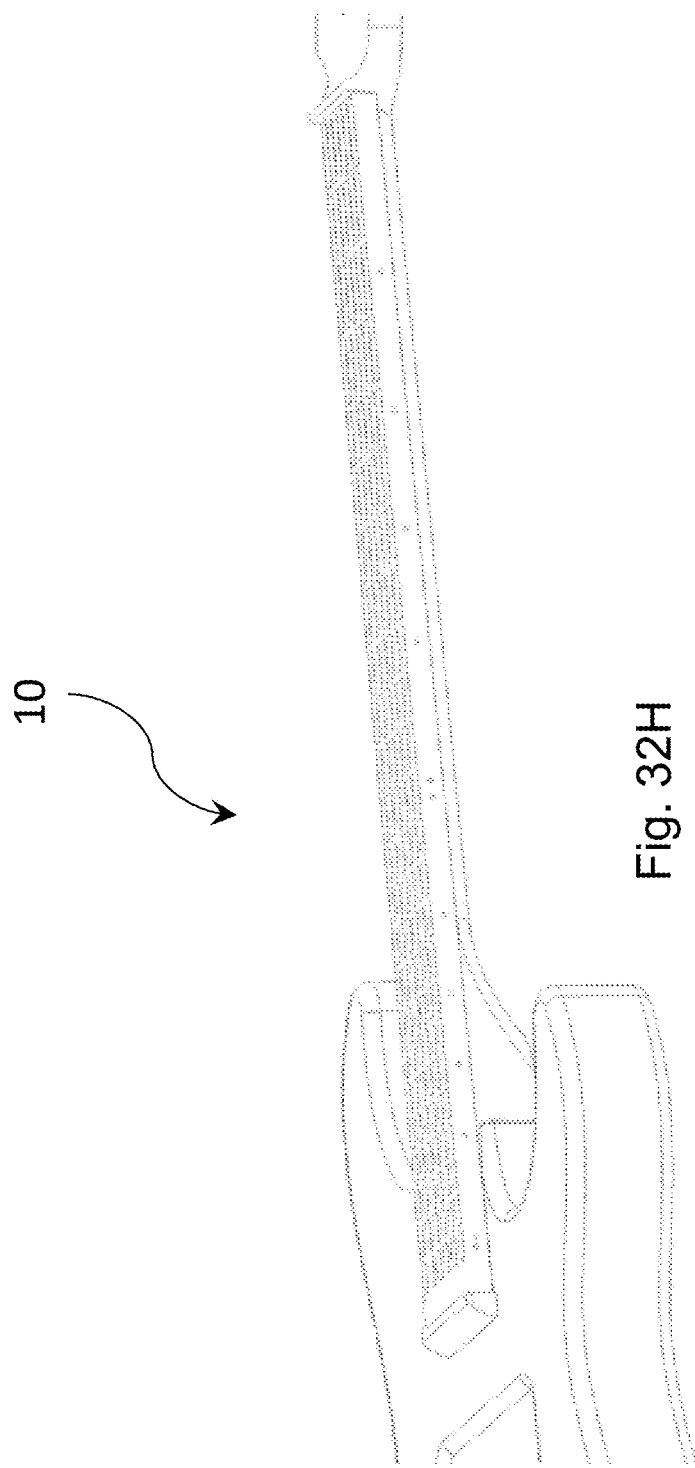
FIG. 32H is a partial top perspective view of the instrument.
Figure 32J:
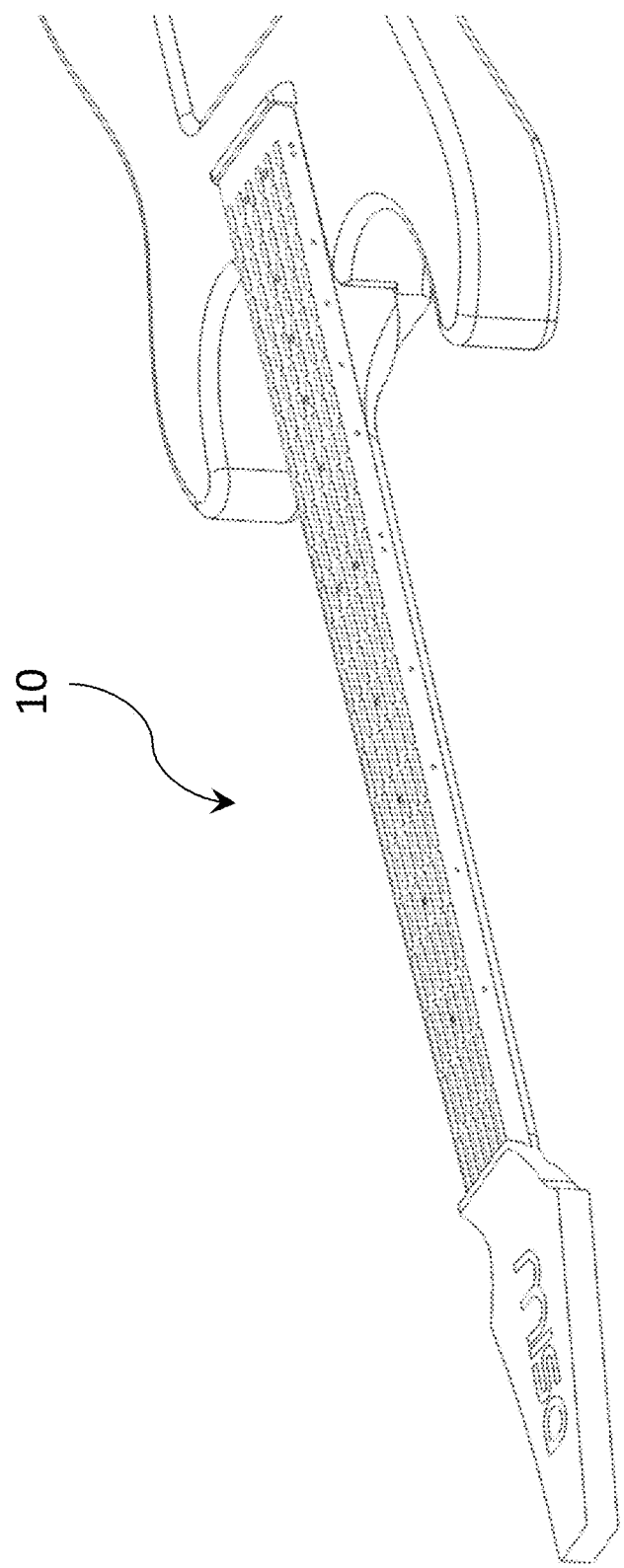
FIG. 32J is a partial top perspective view of the instrument.
Figure 32K:
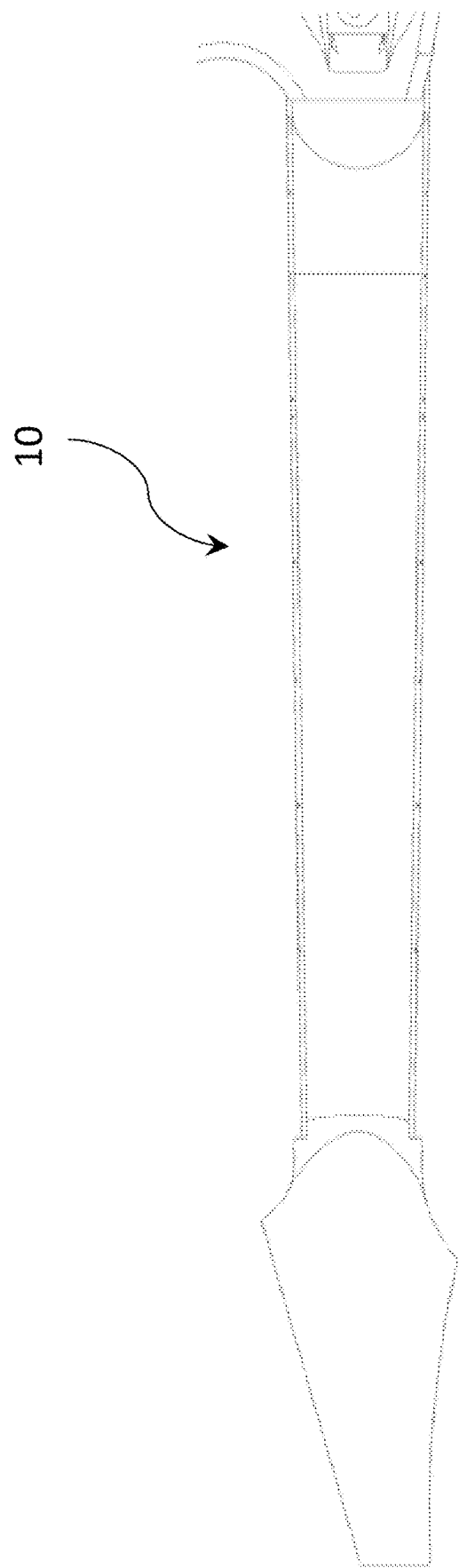
FIG. 32K is a partial bottom view of the instrument.
Figure 33:
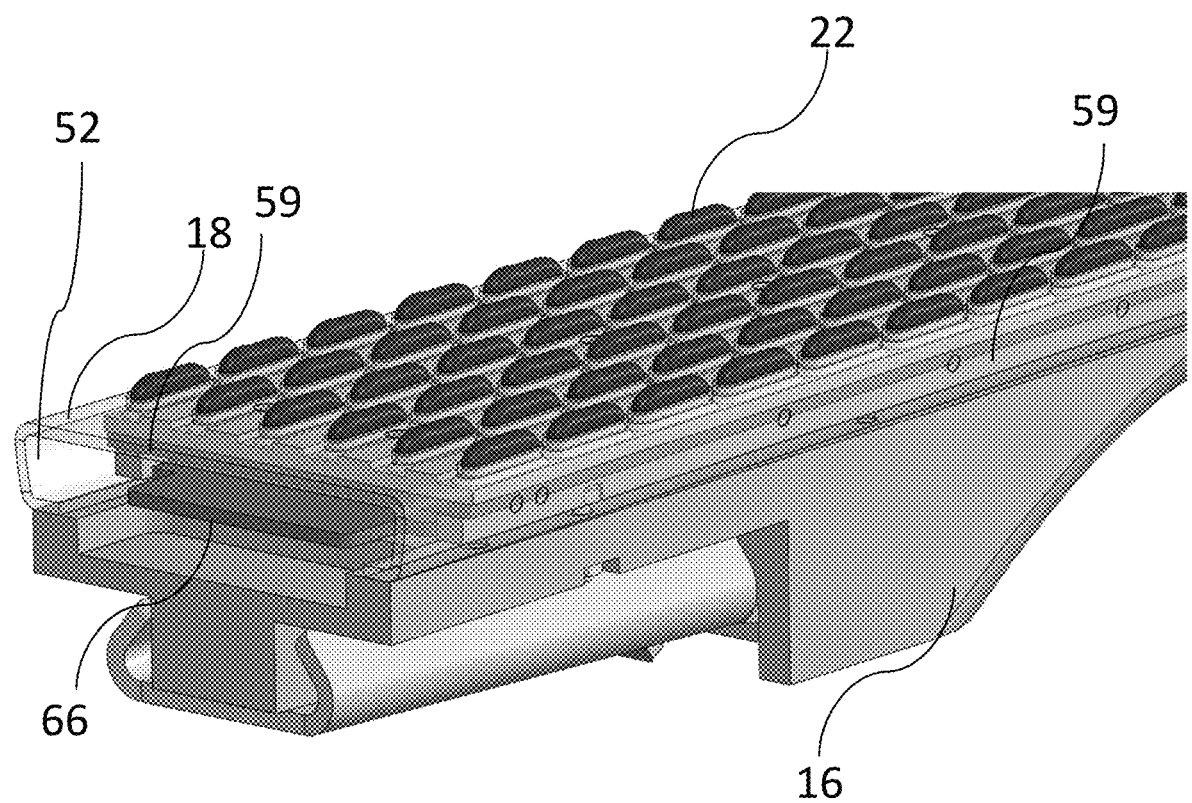
FIG. 33 is partial end perspective view of the neck assembly with the neck box shown in phantom.

As shown in FIG. 1, a display 28 is positioned in instrument body 14. Display 28 can be rectangular, circular, star-shaped or a variety of other shapes. Display 28 can be embedded in instrument body 14 in a manner that covers or hides the bezel (not shown) of display 28. Display 28 may vary in type, such as LCDs or OLEDs. Display 28 is touch-sensitive and can receive the tactile manipulation of an operator to synthesize the sound produced by instrument 10. Display 28 can also provide different GUIs that allow an operator to adjust the settings of instrument 10, such as synthesizing the sounds produced by instrument 10 and the type of instrument sound, such as an electric guitar, acoustic guitar, bass guitar, other string instruments, woodwind instruments, brass instruments, synthesized sounds, such as those produced by traditional synthesizers, etc. As such, the operation of instrument 10 is not limited to that of a traditional guitars' operation, and the software of instrument 10 allows display 28 to serve a variety of functions and allows the musician a greater degree of flexibility. A knob 30 can also be mounted on instrument 10 to allow for convenient adjustment of the functions of instrument 10. A plurality of input or output ports 32 can also be disposed on the surface of instrument body 14, such as on the side or on the back of instrument body 14 as shown in FIGS. 31E and 31J. Input or output ports 32 can provide or receive signals to or from speakers, computers or other instruments in communication with instrument 10.

Figure 19:
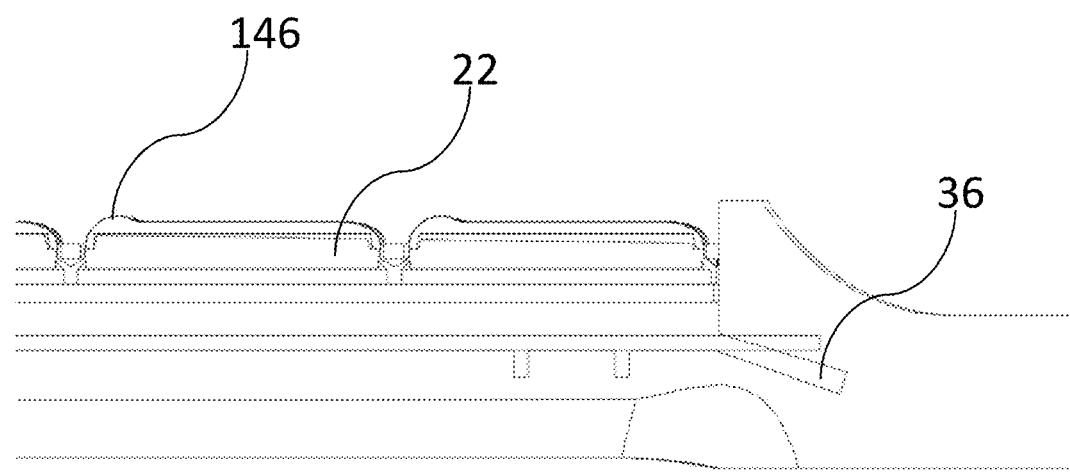
FIG. 19 is a partial cross-sectional side view of the neck box attached to a headstock of the neck body.
Figure 34:
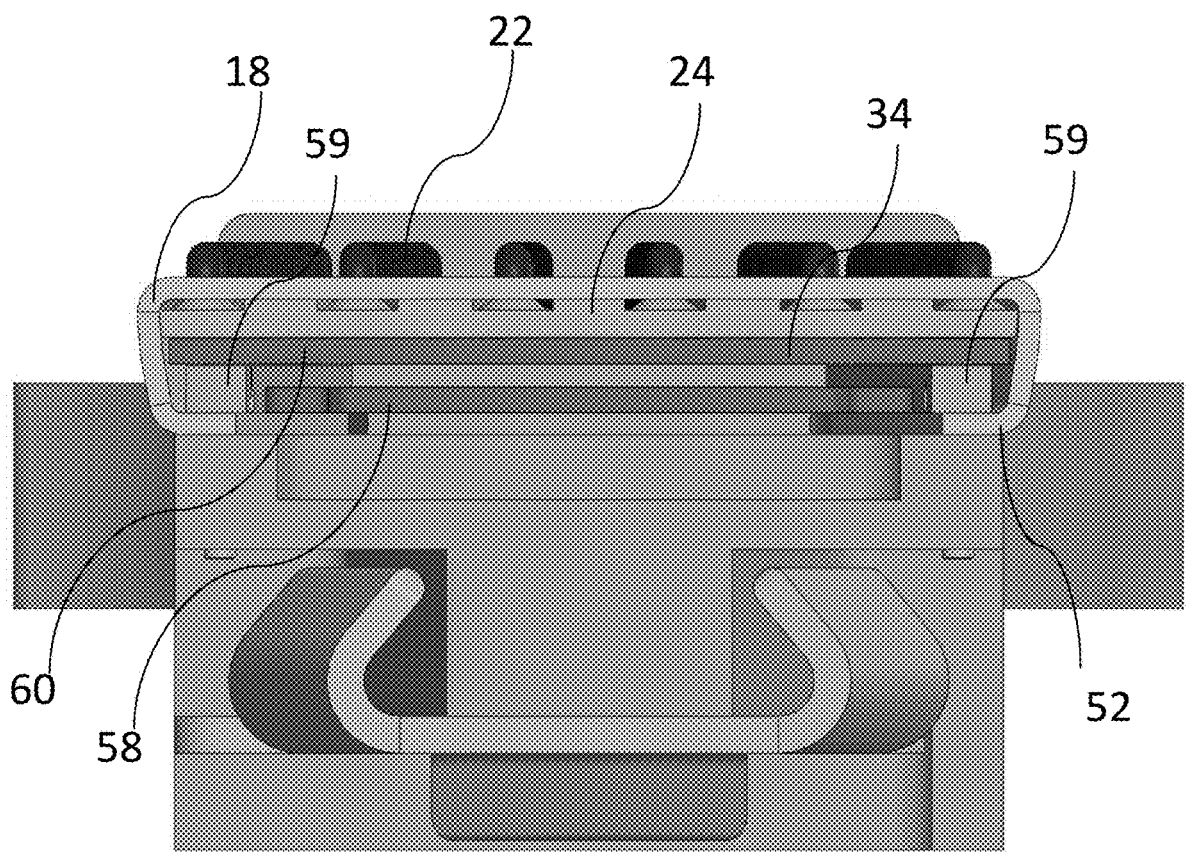
FIG. 34 is an end view of the neck assembly.
Figure 35:
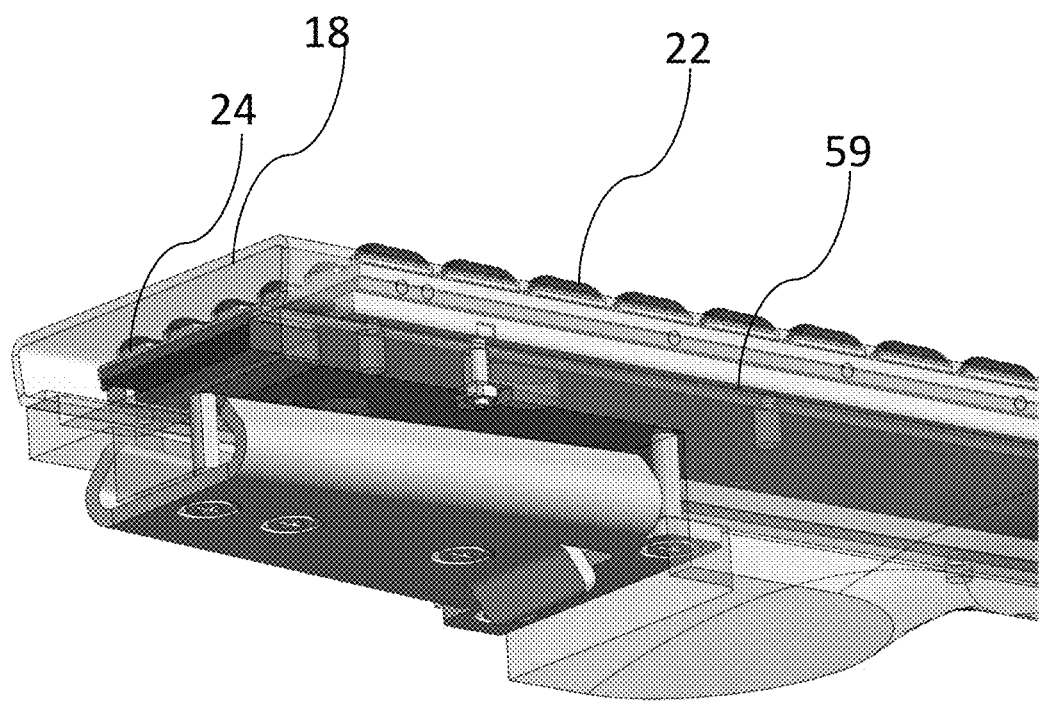
FIG. 35 is a partial bottom perspective view of the neck assembly with the neck box and neck body shown in phantom.
Figure 36:
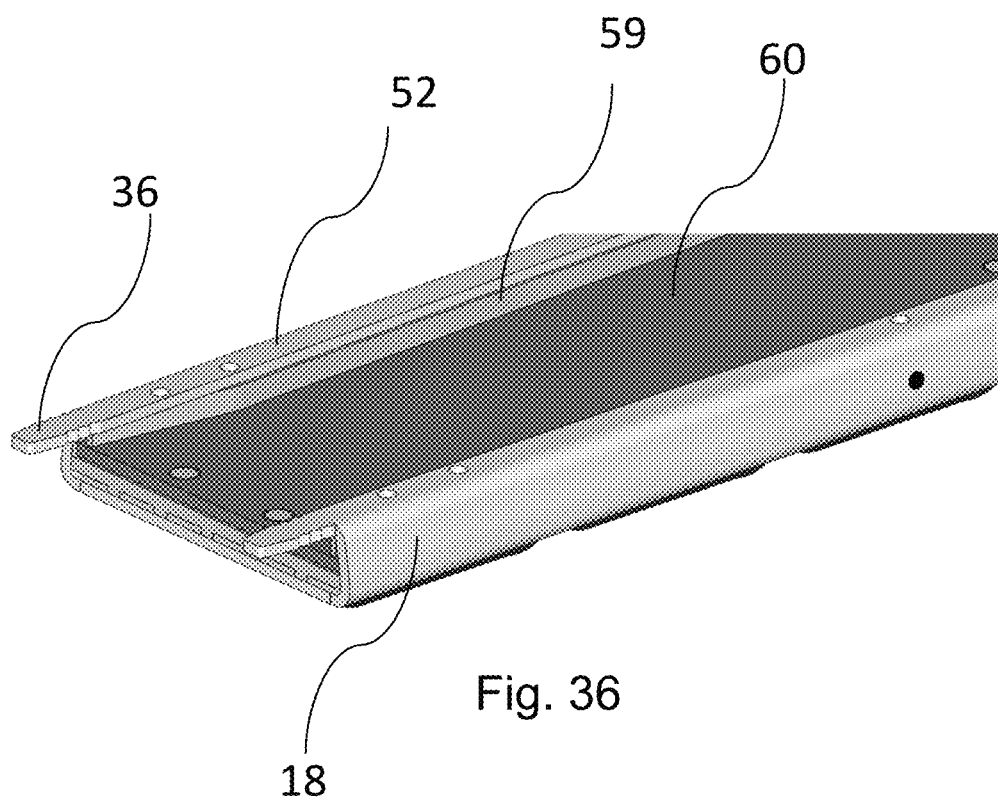
FIG. 36 is a partial perspective view of the neck box and circuit board.

As shown in FIGS. 4 and 34, plurality of buttons 22, flexible film 24, and a circuit board assembly 34 can be assembled under neck box 18. Subsequently, neck box 18 can be assembled with neck body 16. Neck box 18 has two extensions 36 (similar to tabs) at one end of neck box 18, opposite instrument body 14. Extensions 36 can be nested in two corresponding holes 38 of headstock 20. This allows one end of neck box 18 to be fixed onto neck body 16. In some embodiments, as shown in FIG. 19, extensions 36 may not be parallel to the longitudinal side of neck box 18, forming an angle. Additionally, holes 38 in headstock 20 may be angled down by about 20 degrees. This causes extensions 36 to bend slightly when neck box 18 is lowered into position atop neck body 16, and this bending pushes neck box 18 down toward neck body 16 and reduce space between the surfaces of neck body 16 and neck box 18 along the length of neck assembly 12. Extensions 36 are not visible when neck box 18 and neck body 16 are assembled.

Figure 17A:
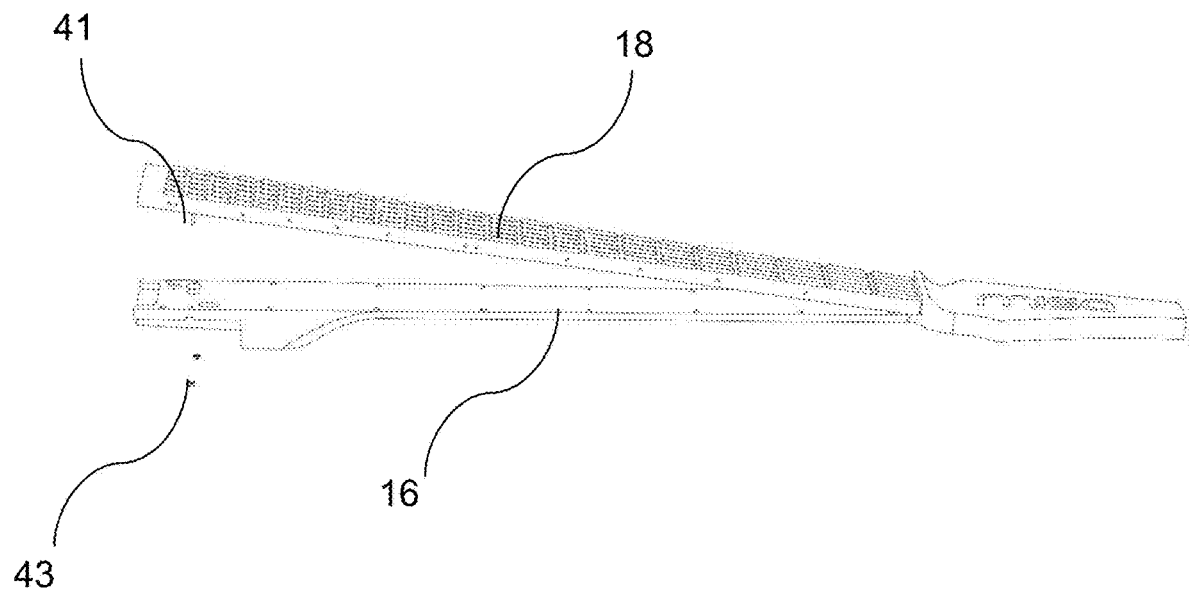
FIG. 17A is a view similar to FIG. 16.
Figure 17B:
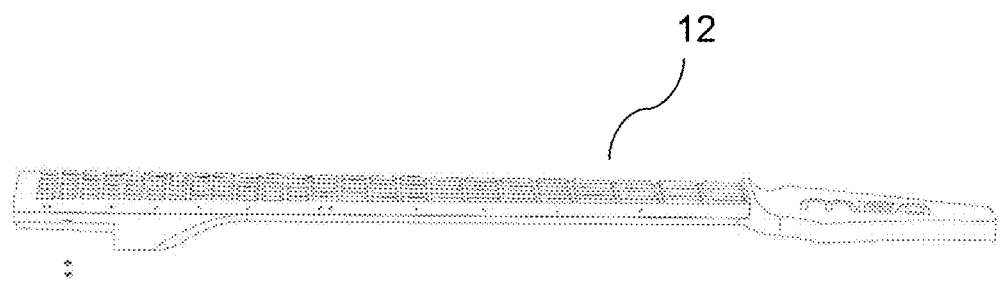
FIG. 17B is view similar to FIG. 17A showing the neck box positioned on the neck body.
Figure 17C:
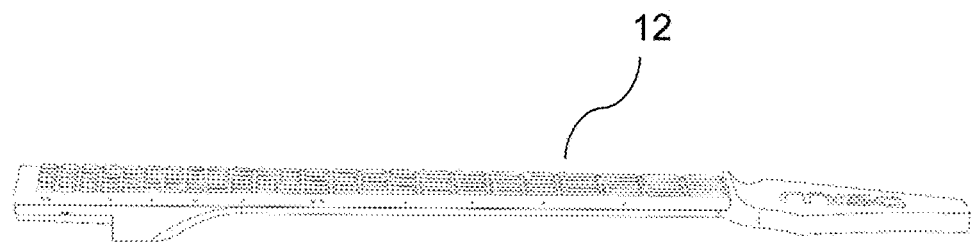
FIG. 17C is a view similar to FIG. 17B showing the neck box attached to the neck body by set screws (shown in FIG. 17B).

As shown in FIGS. 15, 16, and 17A-17C, the other end of neck box 18 would be fixed to neck body 16 by at least one fastener 40, such as screws or bolts. Additionally, the end with fastener 40 would be inserted into instrument body 14, such that fastener 40 are obscured during use of instrument 10. As shown in FIGS. 17A-17C, neck box 18 may be fastened to neck body 16 by a bold 41 and nut 43. Additionally, as shown in FIGS. 31E and 31F, neck body 16 is devoid of visible fasteners 40. The attachment components are obscured by either headstock 20 or instrument body 14.

Neck assembly 12 is preferably removable from instrument body 14, which reduces the overall length of instrument 10, improves portability, and allows for repair and customization, such as attaching different neck assemblies to different instrument bodies. A latch 42 holds neck assembly 12 firmly to instrument body 14 as if it were screwed in like a traditional electric guitar neck (not shown).

Figure 13:
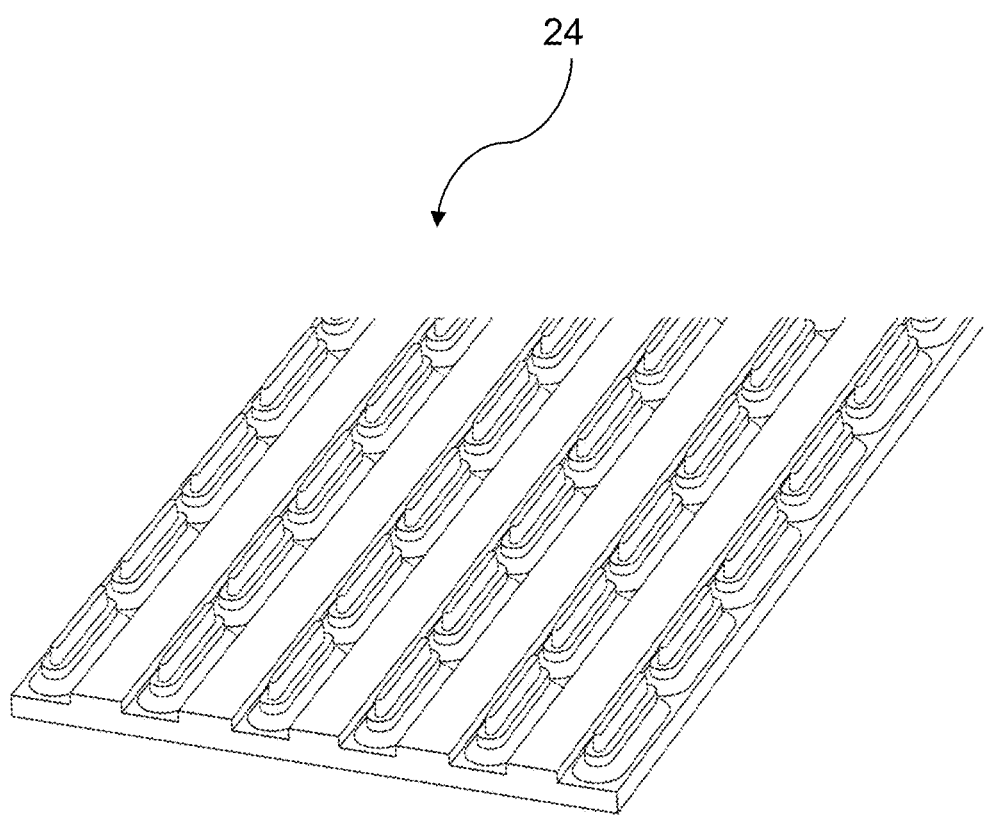
FIG. 13 is a partial top perspective view of the flexible film.
Figure 14:
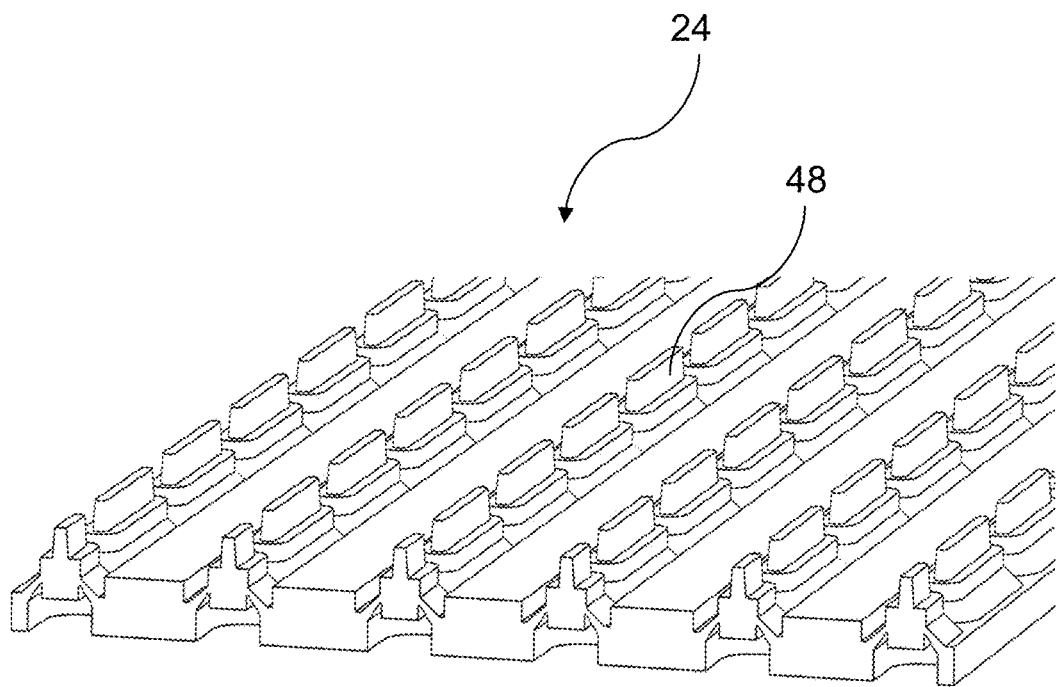
FIG. 14 is a partial cross-sectional perspective view of the flexible film.
Figure 15:
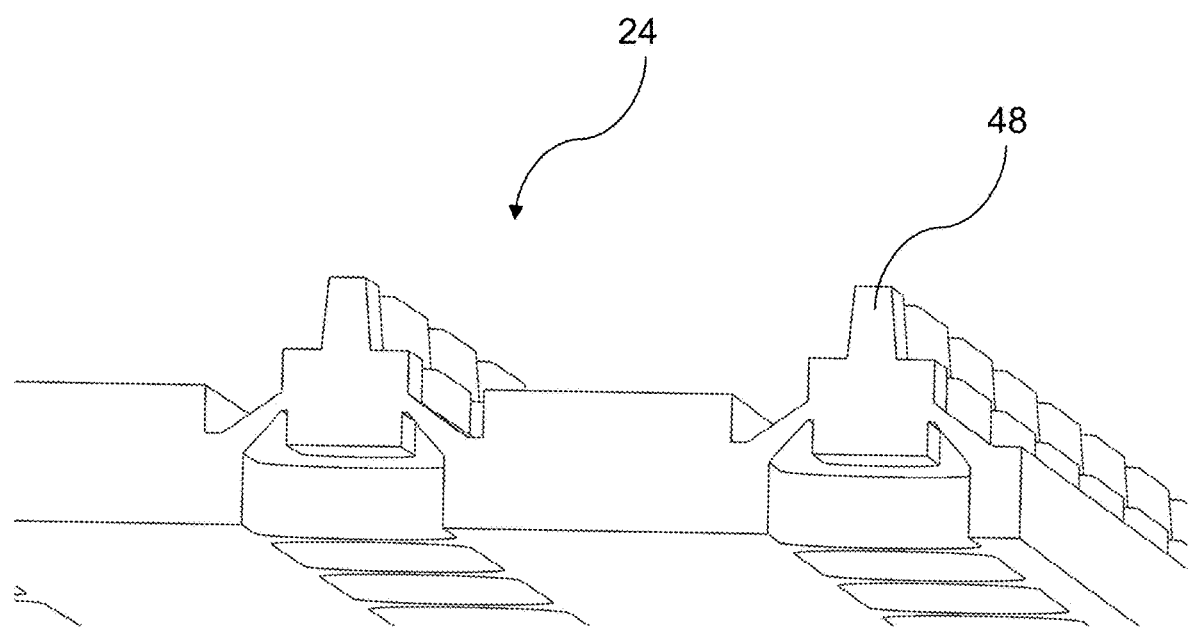
FIG. 15 is a partial cross-sectional perspective view of the flexible film.

As shown in FIG. 4, buttons 22 protrude from the top surface of neck box 18. Buttons 22 have concavities therein that receive protrusions of flexible film 24 (as shown in FIG. 13). As shown in FIGS. 8-11, plurality of buttons 22 are connected by a stem 44 and a plurality of branches 46. As shown in FIG. 14, flexible film 24 has plurality of hollow bulges 48. A plurality of conductors 50 (see FIG. 10) are placed therein. Supported by ridges 432 between two bulges 48 on flexible film 24, conductors 50 will not contact the bottom of ridges 432 without any pressure being placed on bulges 48. When sufficient pressure is applied to a bulge 48 (i.e. an operator pushes one of buttons 22), bulge 48 is depressed and conductor 50 move down to contact points (not shown) on circuit board assembly 34.

Figure 2:
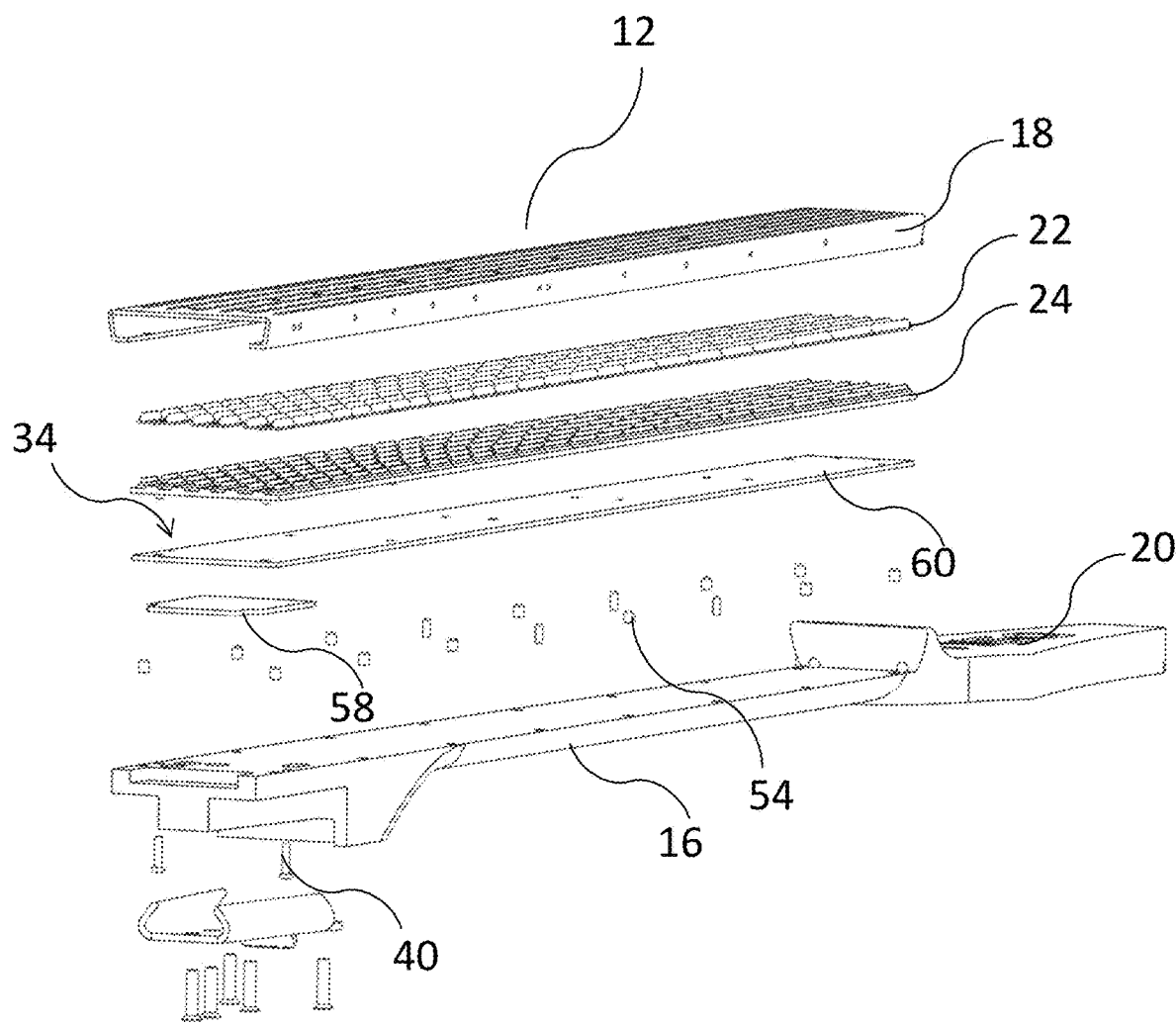
FIG. 2 is an exploded perspective view of the neck assembly including a neck box positioned at a top of the assembly, a plurality of buttons positioned under the neck box, a flexible film positioned under the plurality of buttons, an elongated circuit board positioned under the flexible film, and an elongated neck body positioned at a bottom of the assembly.

As shown in FIG. 2, circuit board assembly 34 is positioned (at least partially) within neck box 18. Circuit board assembly 34 has electrical components embedded on it. The circuitry may comprise electronic components such as integrated circuits, resistors, capacitors, and other passive or active components. The circuitry is used to detect the movement of buttons 22 by sensing the displacement of bulges 48 in flexible film 24. Specifically, the circuitry may have a plurality of contact points (not shown). When a particular button 22 is pressed down, a conductor 22 positioned under that particular button 22 bridges two contact points in circuit board assembly to short the gap between the contact points. When these contact points are shorted, the circuitry of circuit board assembly 34 detects the particular short and send a signal to display 16 that a note associated with the particular button 22 should be played.

Conductor 50 is capsule shaped and approximately the same length and width of the respective button 22 under which it is positioned. Conductors 50 are preferably flexible and made of cooper, carbon, or other electrically conductive material.

As shown in FIG. 4, flexible film 24 is situated between plurality of buttons 22 and circuit board assembly 34. As discussed above, when one of buttons 22 is depressed toward flexible film 24, bulge 48 of flexible film 24 is displaced, and a conductor 50 underneath pressed button 22 contacts both contact points on circuit board assembly 34. Conductor 50 therefore closes or shorts the gap between the contact points to provide an electronic signal that can be used to indicate specific button 22 was pressed. This specific implementation is merely an example, sensors other than contact points may be used, such as resistive sensors, capacitive sensors, and piezoelectric sensors. Conductors 50 are not necessary if other specific types of sensors is applied.

As shown in FIG. 2, neck box 18 receives plurality of buttons 22, flexible film 24, and a circuit board assembly 34. As shown in FIGS. 32-35, neck box 18 includes rails 52 disposed at two concave sides of neck box 18. Set screws 54 press on circuit board assembly 34. The further set screws 54 are driven into rails 52 of neck box 18, the further circuit board assembly 34 is driven toward the top of neck box 18. Because flexible film 24 is positioned between circuit board assembly 34 and the top of neck box 18 and buttons 22, the flexible film 24 is squeezed as set screws 54 are driven further into neck box 18. As the squeezing increases, the amount of force applied by flexible film 24 on buttons 22 increases. This increase in force pushes buttons 22 closer to contact points on circuit board assembly 34 to decrease the distance that buttons 22 must travel before respective contact points are electrically shorted causing a note to be played. The increase in force resulting from the increased squeezing increases the force required from the user to press down buttons 22 increasing the tactile stiffness of buttons 22. If set screws 54 are backed out more from neck box 18, the opposite occurs so that buttons 22 must travel further to short contact points and less force is required to depress buttons 22. Set screws 54 are located at various locations along neck box 18 so that buttons 22 can be adjusted at various zones along neck assembly 12. According to the preferred embodiment, eight set screws 54 are provided along each side of neck box 18 for adjustment of the relative position of circuit board assembly 34 to neck box 18. According to an alternative embodiment of the present disclosure, buttons 22 extend higher or lower relative to neck box 18 based on the amount that set screws 54 are driven into rails 52 based on a relatively fixed position of buttons 22 relative to circuit board assembly 34. Thus, as circuit board assembly 34 travels up and down relative to neck box 18, buttons 22 also travel up and down relative to neck box 18 and extend more or less from neck box 18.

Figure 18:
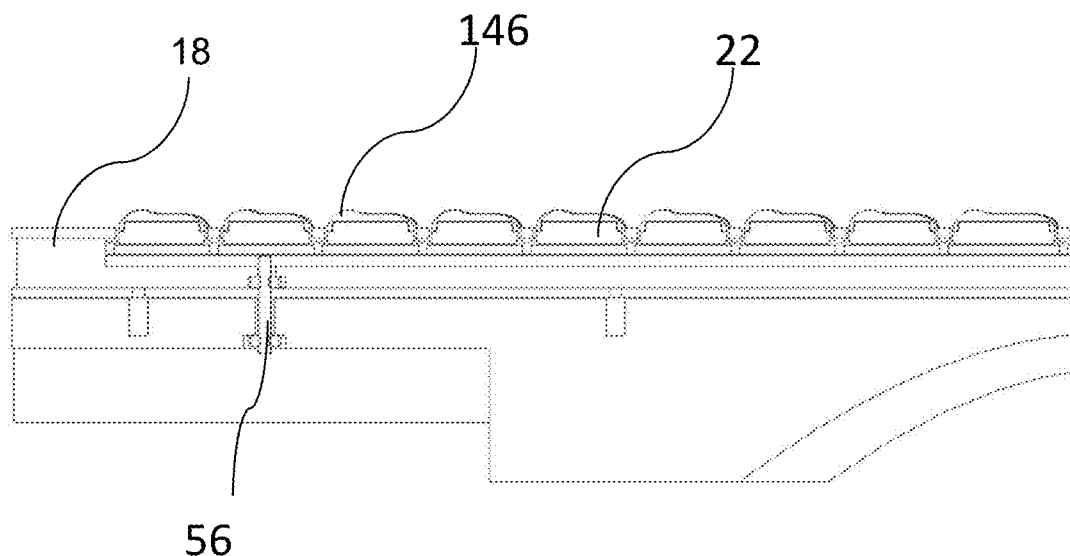
FIG. 18 is a partial cross-sectional side view of the neck box attached to the neck body.

As shown in FIG. 18, neck box 18 is fixed on a neck body 16 by a plurality of long set screws 56. Long screws 54 extend into rails 54 and may also be used to adjust the relative position of circuit board assembly 34 relative to neck box 18. As shown in FIG. 18, a portion of long screws 56 extend below rail 52 and into holes in neck body 16. During assembly, an adhesive, such as glue, is positioned in these holes to secure long screws 56 to neck body 18. When the glue dries/cures, screws 56 are held in place so that neck box 18 is secured to neck body 16. Long screws 56 may be placed at several locations along the length of neck assembly 12 to hold neck box 18 to neck body 16. Screws 54, 56 are covered by neck body 16 and neck box 18 so they are not visible when instrument 10 is fully assembled.

Figure 20:
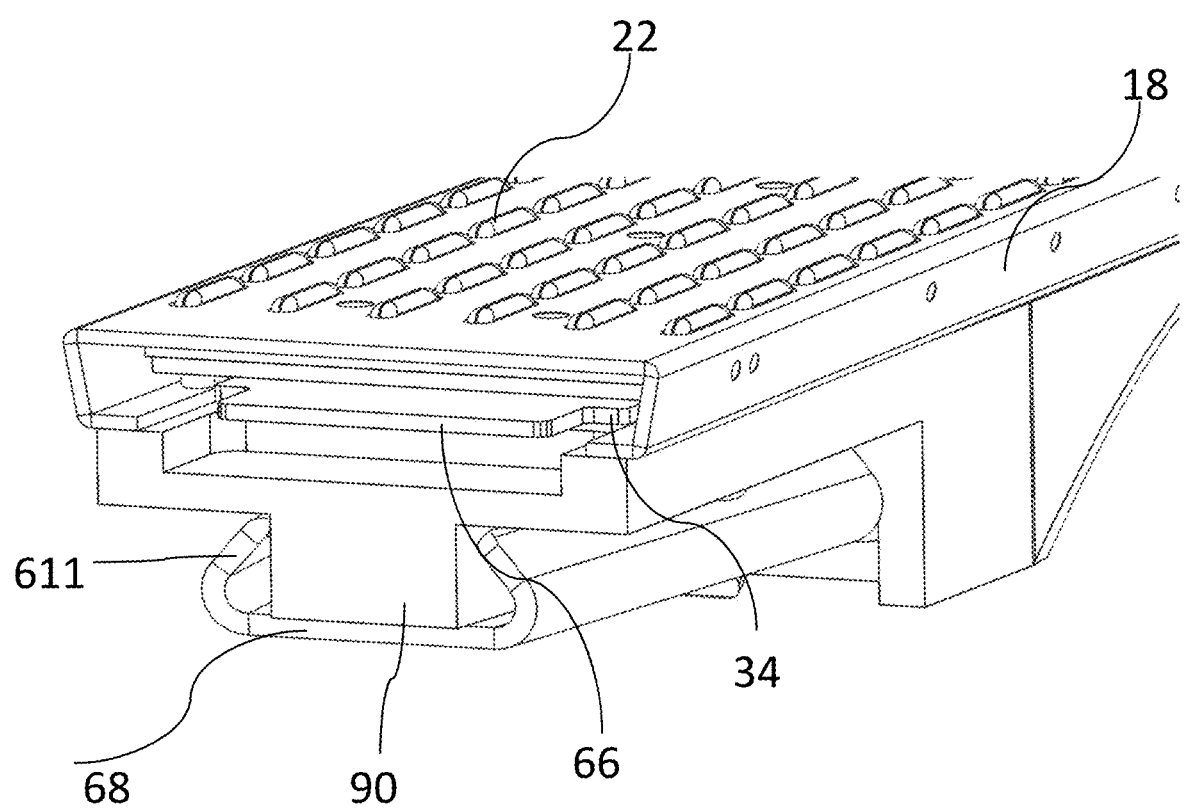
FIG. 20 is a partial perspective end view of the neck assembly.

Circuit board assembly 34 includes a first circuit board 58 and a second circuit board 60 stacked with each other as shown in FIG. 2. First circuit board 58 is positioned on one end of second circuit board 60 opposite buttons 22. The contact points discussed above are positioned on second circuit board 60 to detect depression of buttons 22 along neck assembly 12. First circuit board 58 is electrically coupled to second circuit board 60 by a connector (not shown). First circuit board 58 detects when respective pairs of contact points have been shorted (i.e. a conductor 50 is sufficiently depressed by a button 22) and processes the signals. For example, as shown in FIG. 20, the circuitry on first circuit board 58 may convert the signals from the plurality of contact points into serial/digital signals, such that cartridge connector 66 located at one end of first circuit board 58 (as shown in FIG. 20) requires fewer pins than the number of buttons 22.

As shown in FIGS. 33-36, rails 59 may be positioned between rails 52 of neck box 18 and first circuit board 58 to hold first circuit board against neck box 18. Rails 59 may be made of plastic or any other material.

Neck assembly 12 narrows as it extends from instrument body 14 toward headstock 20. Similarly, neck box 18 narrows and rails 52 get closer together as they extend from near instrument body 14 toward headstock 20. Similarly, second circuit board 60 is keystone-shaped narrows as rails 52 get closer together as it extends from near instrument body 14 toward headstock 20.

Figure 24:
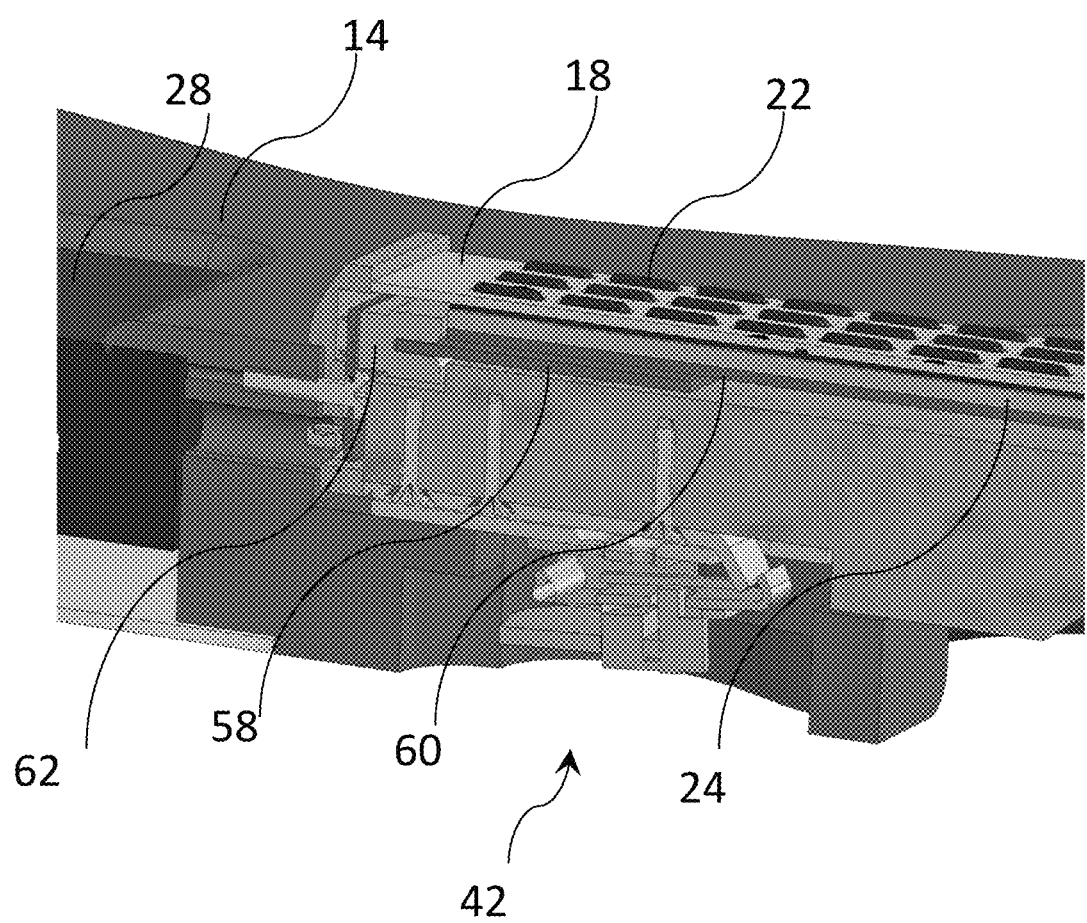
FIG. 24 is a partial cross-sectional perspective view of the latch attaching the neck assembly to the instrument body.
Figure 25:
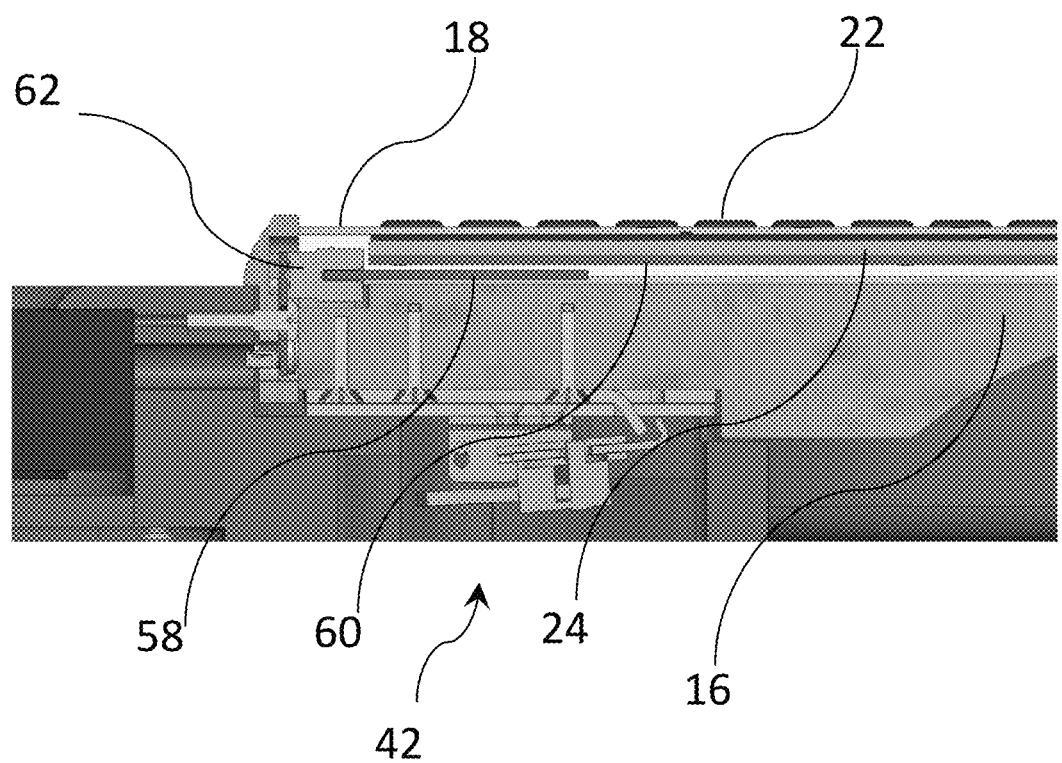
FIG. 25 is a partial cross-sectional side view of the latch attaching neck assembly to the instrument body.
Figure 26:
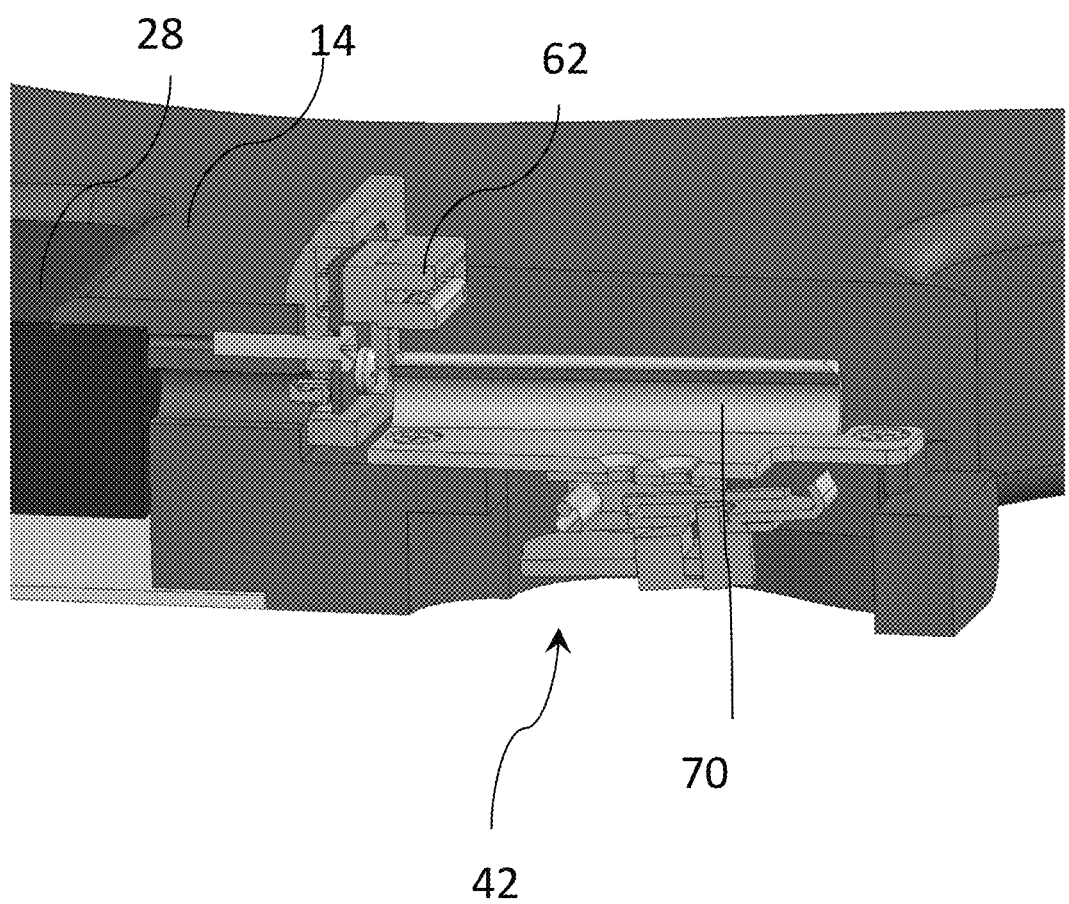
FIG. 26 is a partial cross-sectional perspective of the latch, neck assembly, and instrument body.
Figure 27:
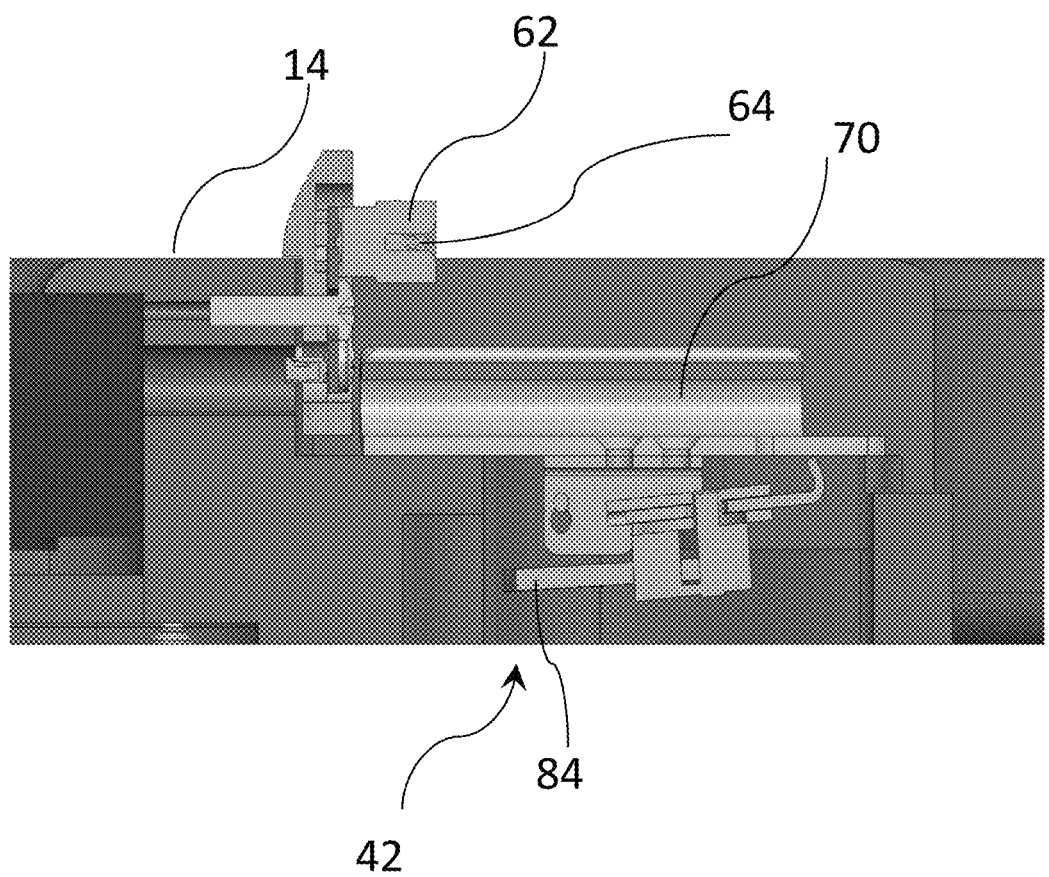
FIG. 27 is a partial cross-sectional side view of the latch, neck assembly, and instrument body.

As shown in FIGS. 24-28, instrument body 14 of instrument 10 has another communication port 62, communication port 62 (sometimes referred to as a female connector or first connector) has a cartridge connector slot 64 that can receive a cartridge connector 66 (sometimes referred to as a male connector or second connector) of first circuit board 58 (as shown in FIG. 25). Communication port 62 and cartridge connector 66 cooperate to define a cartridge connector pair. Therefore, circuitry (not shown) in display 28 positioned in instrument body 14 can receive the processed signals (or even unprocessed signals) from communication port 62 and synthesize the signal to provide signal indicating the note/sound to be played by instrument 10.

As shown in FIGS. 16-19, buttons 22 have nubs 146 thereon. Nubs 146 can be placed on a select number or specific rows of buttons 22, most of buttons 22, or all buttons 22 of instrument 10. Buttons 22 can more accurately simulate the touch and feel of a traditional stringed guitar. In many embodiments, nubs 146 are preferably situated on all of buttons 22. Additionally, as shown in FIG. 16, the length of each of buttons 22 may vary. In the instant embodiment, the lengths of buttons 22 gradually decrease as they get closer to instrument body 14. Nubs 146 on buttons 22 serve to simulate the feel of fret wire so the musician can utilize tactile cues they are familiar with and rely on for hand positioning.

As shown in FIGS. 31A-J and 32A-L, instrument body 14 is merely exemplary, and different kinds of shape or design are available. Furthermore, the shape of headstock 20 is merely exemplary. The shape of display 28 is merely exemplary. The shape and length of neck assembly 12 and neck body 16 are merely exemplary. The shapes of buttons 22 are merely exemplary. The appearance, such as color or shape of instrument 10, shown in the drawing is not meant to exclusively define the scope of the instant disclosure. For example, rather than having the shape show, instrument body 14 may be round, V-shaped, hourglass-shaped, etc.

As shown in FIGS. 22A-22D, latch 42 connects neck assembly 12 to instrument body 14. Latch 42 includes an inner bracket 68 and an outer bracket 70. Inner bracket 68 has two side edges 72 that bend upwardly. Outer bracket 70 is configured to the shape of inner bracket 68 so that the two can nest together. Inner and outer brackets 68, 70 include a plurality of screw holes 74. The number of screw holes 74 may vary in different embodiments.

Figure 21:
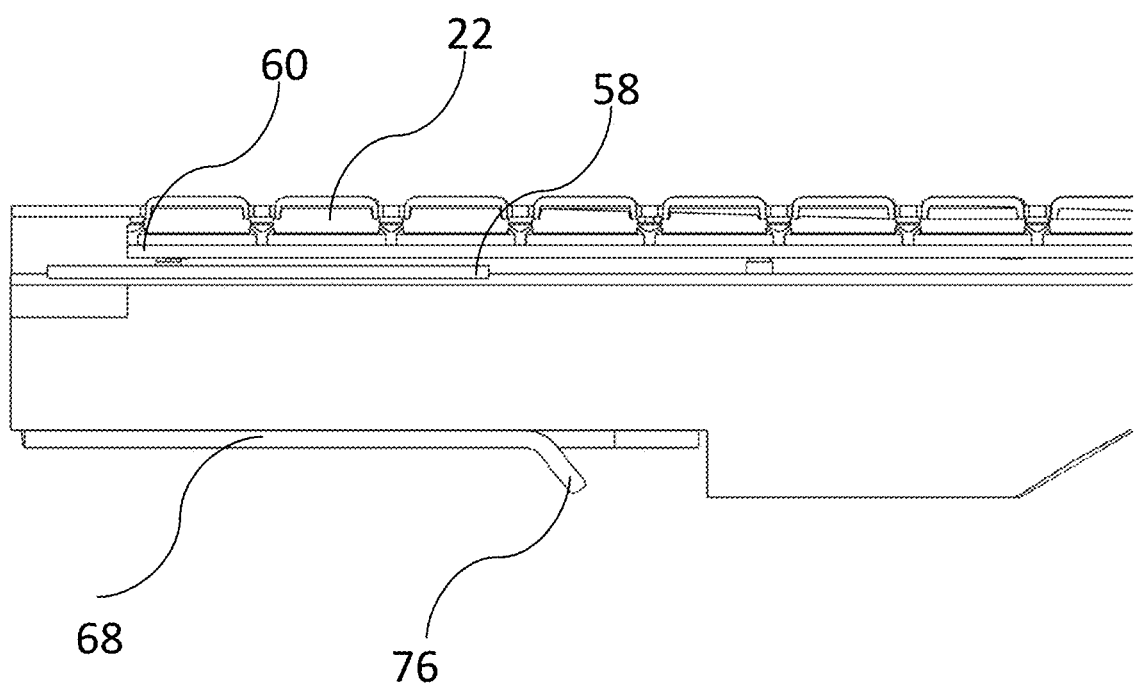
FIG. 21 is a partial cross-sectional side view of the neck assembly.
Figure 23A:
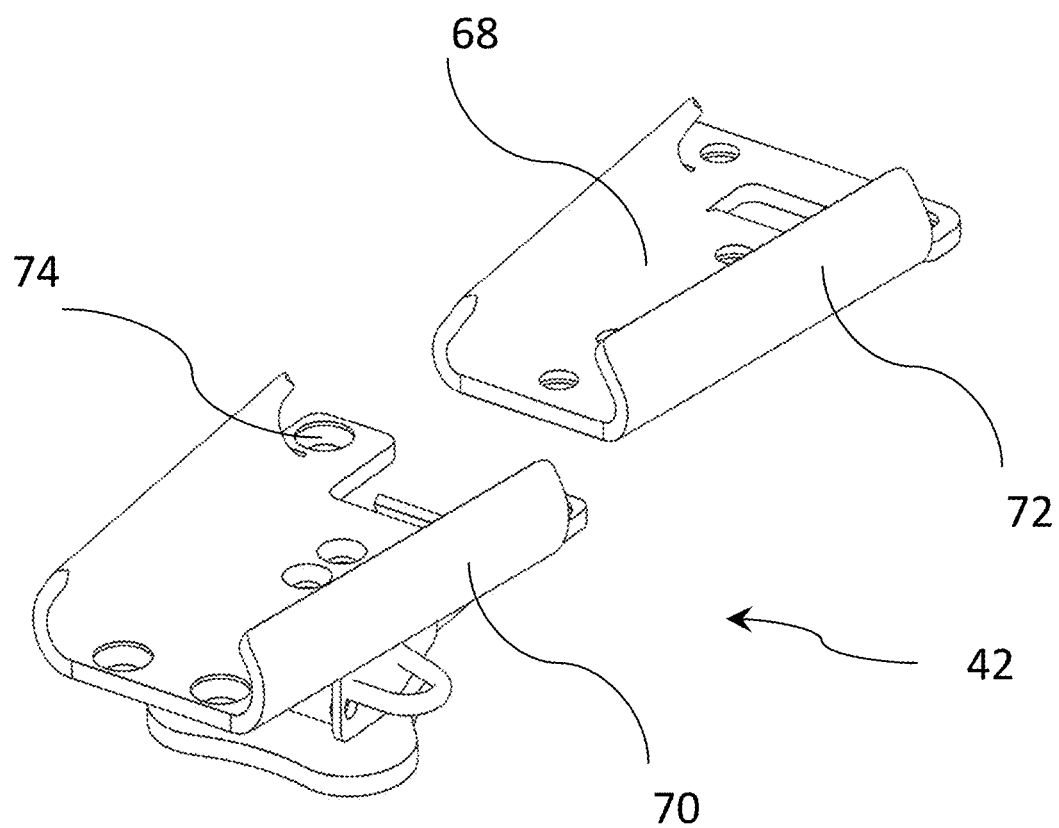
FIG. 23A is a perspective view of inner and outer latch brackets of the latch.
Figure 23B:
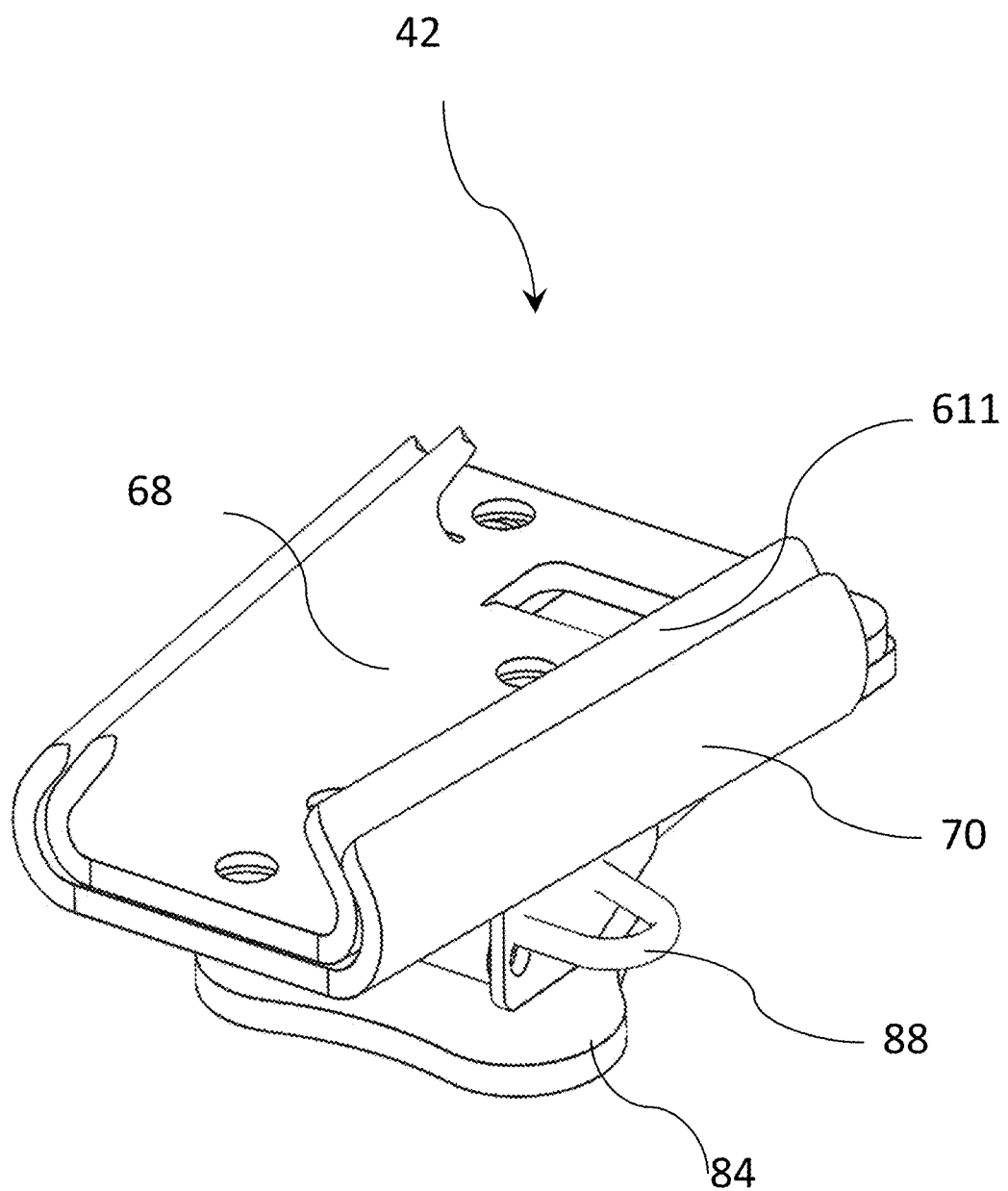
FIG. 23B is a perspective view of the inner and outer latch brackets attached together.
Figure 23C:
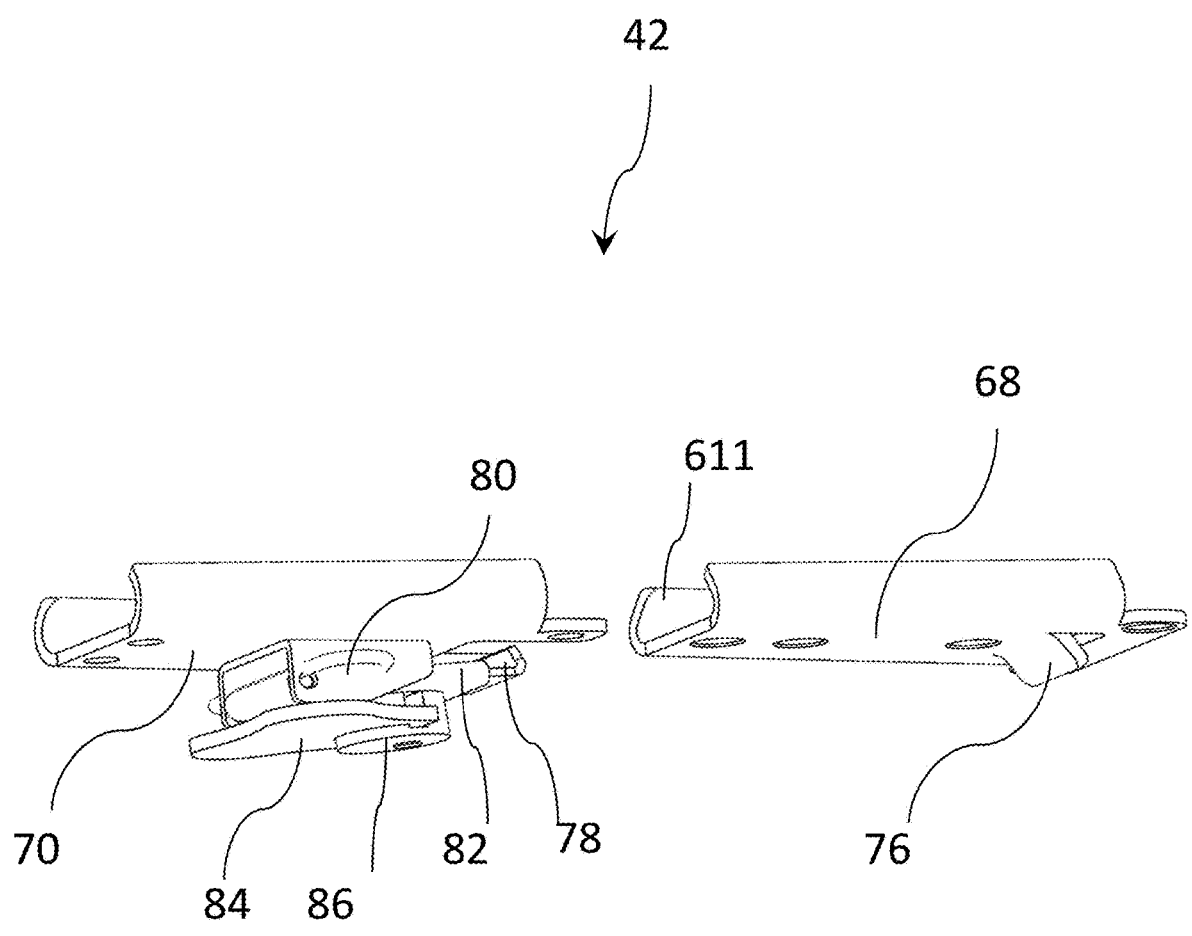
FIG. 23C is a perspective view of the inner and outer latch brackets aligned for attachment.
Figure 23D:
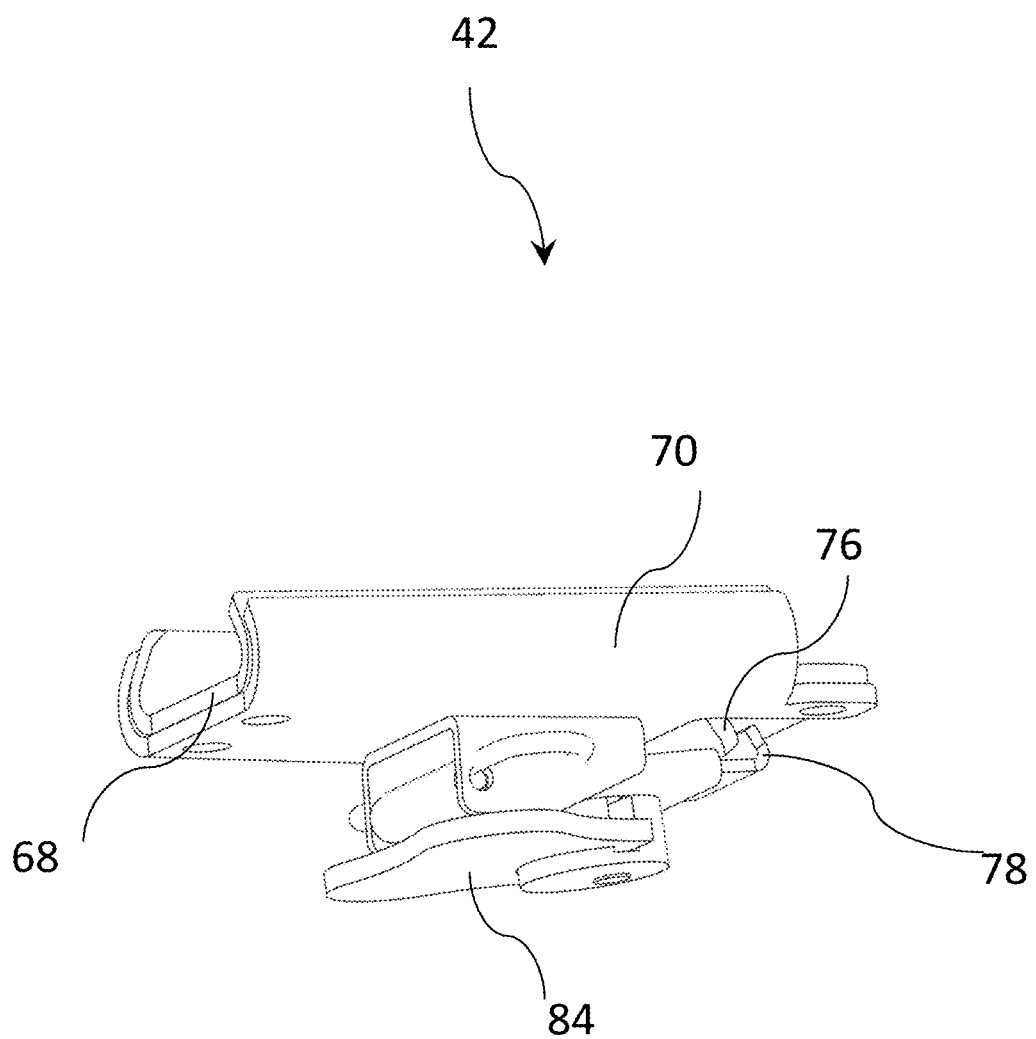
FIG. 23D is a perspective view of the inner and outer latch brackets attached together.
Figure 23E:
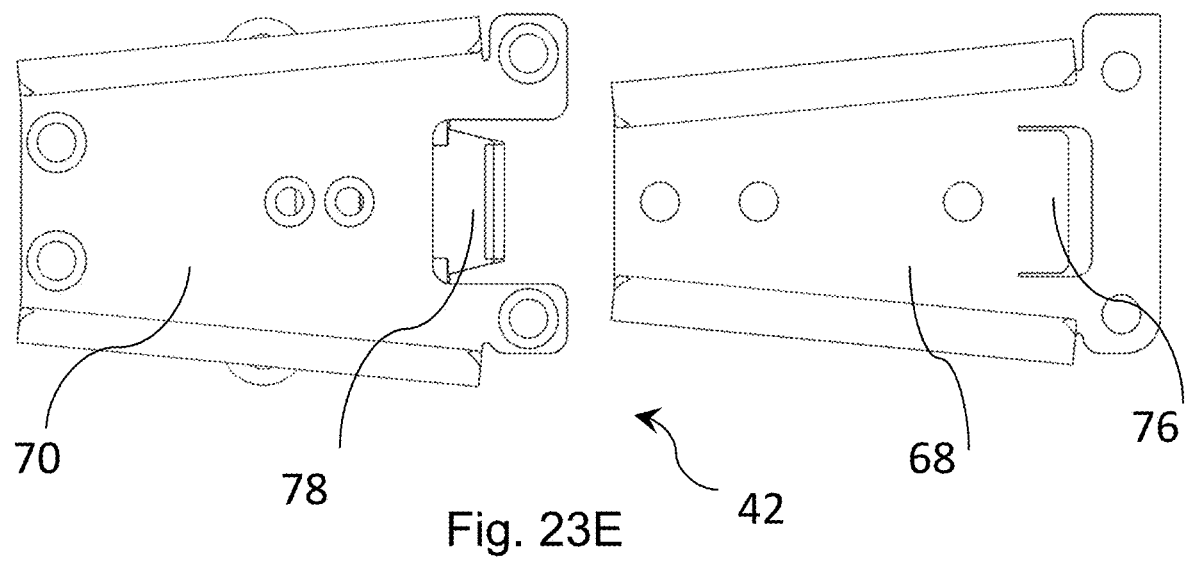
FIG. 23E is a top view of the inner and outer latch brackets.

As shown in FIGS. 23C and 23E, inner bracket 68 further includes a bracket tail 76, and outer bracket 70 further includes a bracket hook 78. Bracket tail 76 bends away from inner bracket 68, as shown in FIG. 21. A first end of a bracket hook 78 is configured to the shape of bracket tail 76 so that it can hook onto bracket tail 76 when inner bracket 68 is nested inside outer bracket 70. A toggle system connects bracket hook 78 to outer bracket 70. The toggle system includes a toggle base 82, a hook holder 82, and a rotating handle 84. Toggle base 82 is coupled to a back of outer bracket 70 with at least one screw. Hook holder 82 is pivotally fixed onto toggle base 82. Rotating handle 84 further includes a post 86. Hook holder 82 contacts post 86. Rotating handle 84 is pivotally coupled to post 86. A second of outer bracket 70 is positioned adjacent post 86 inside hook holder 82. Post 86 includes a cam (not shown) that contacts hook 78. A spring 88 urges hook 78 toward post 86. As handle 84 is rotated, the cam pushes hook 78 away from post 86 against the force of spring 88. As handle 84 is further rotated, the cam provides clearance from hook 78 to move toward post 86. To latch inner and outer brackets 68, 70, hook 78 is rotated to it clears bracket tail 76. Hook 78 is then pressed down so it is positioned in front of bracket tail 76. Handle 84 is then turned to pull hook 78 toward post 86 so that hook 78 grabs bracket tail 76. To release latch 42, an opposite process is followed. According to other embodiments, other latch configurations may be used. According to other embodiments, other coupling mechanism than latches may be used.

As shown in FIG. 20, neck body 16 includes a bridge 90. Bridge 90 is located at the back end of neck body 16. Inner bracket 68 receives short bridge 90 and is secured thereto with at least screw, as also shown in FIG. 22D.

Figure 28:
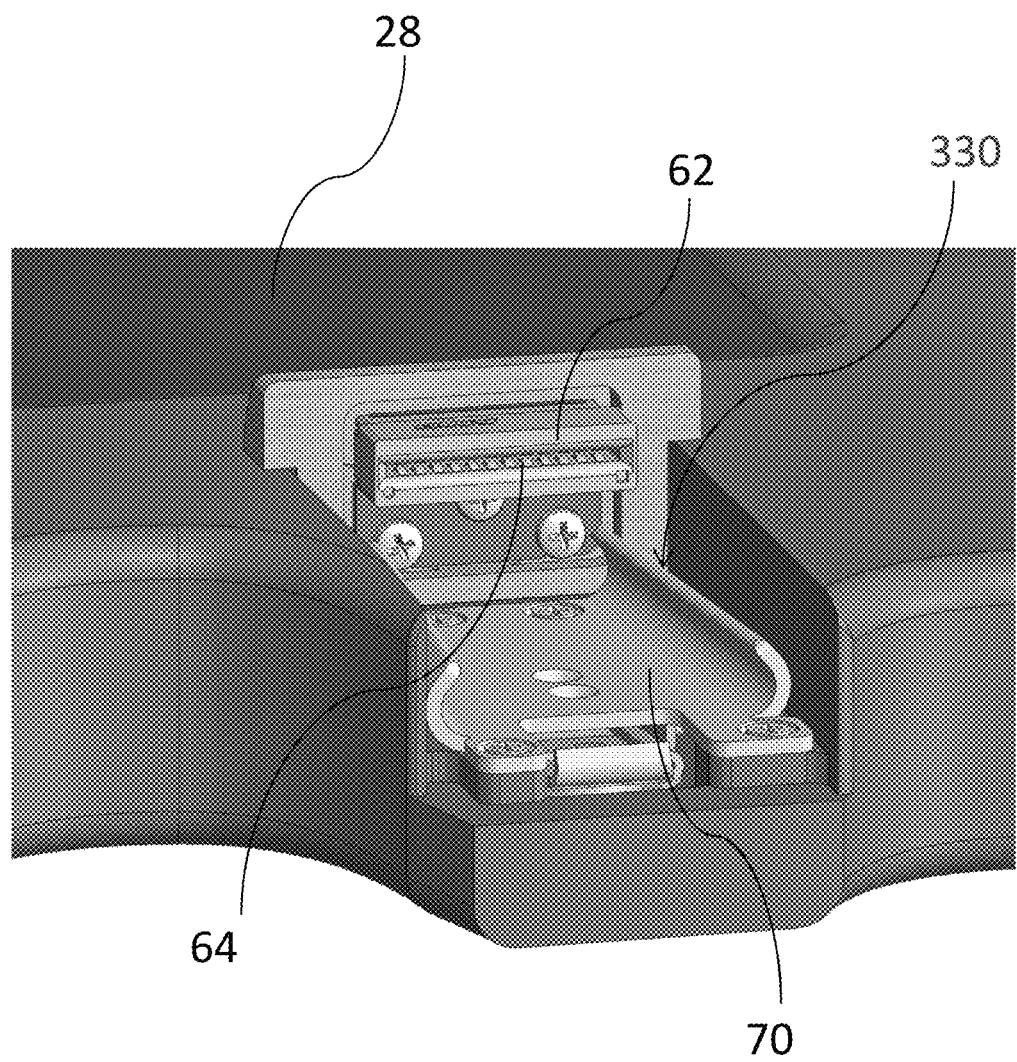
FIG. 28 is a partial perspective view of the outer latch bracket fastened to the instrument body.
Figure 29:
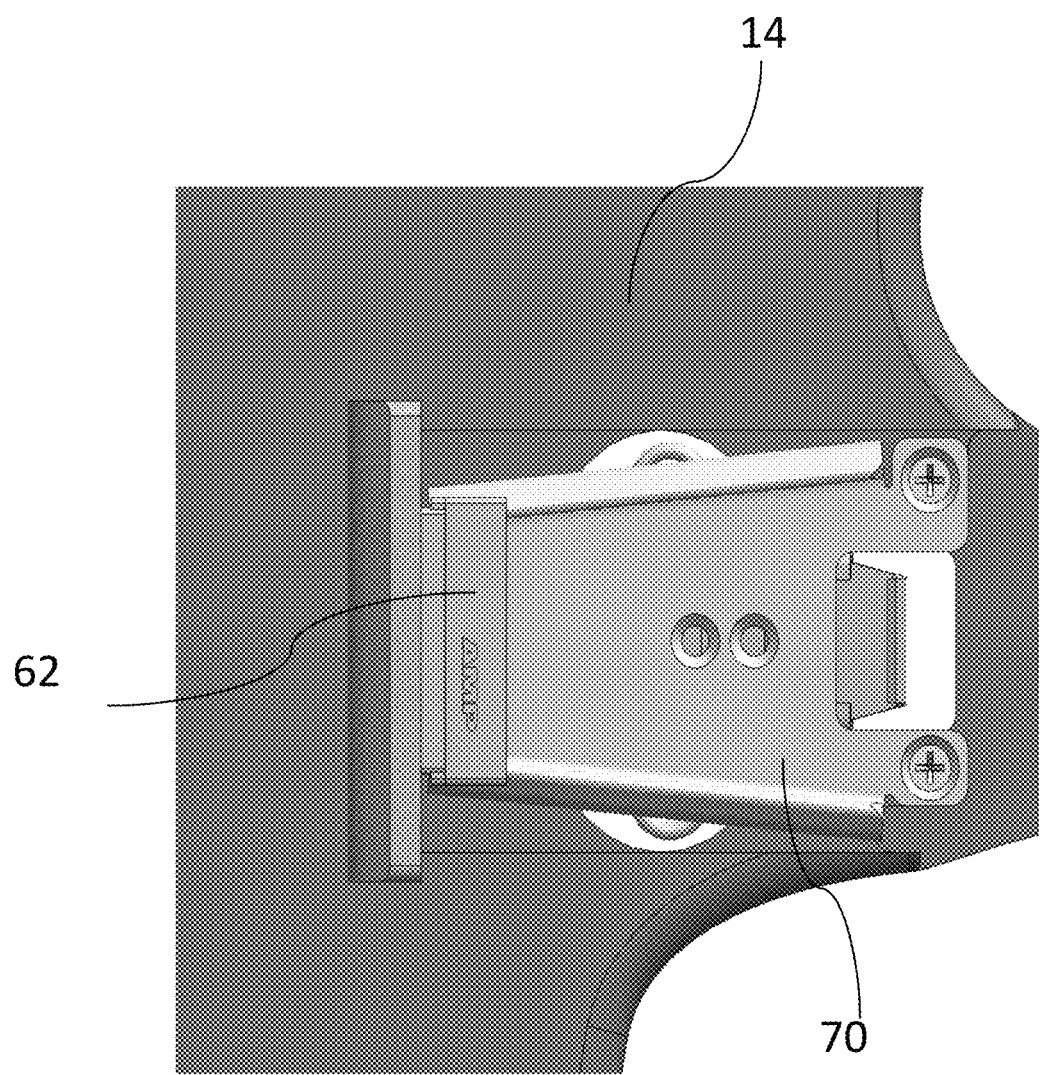
FIG. 29 is a partial top view of the outer latch bracket fastened to the instrument body.
Figure 30:
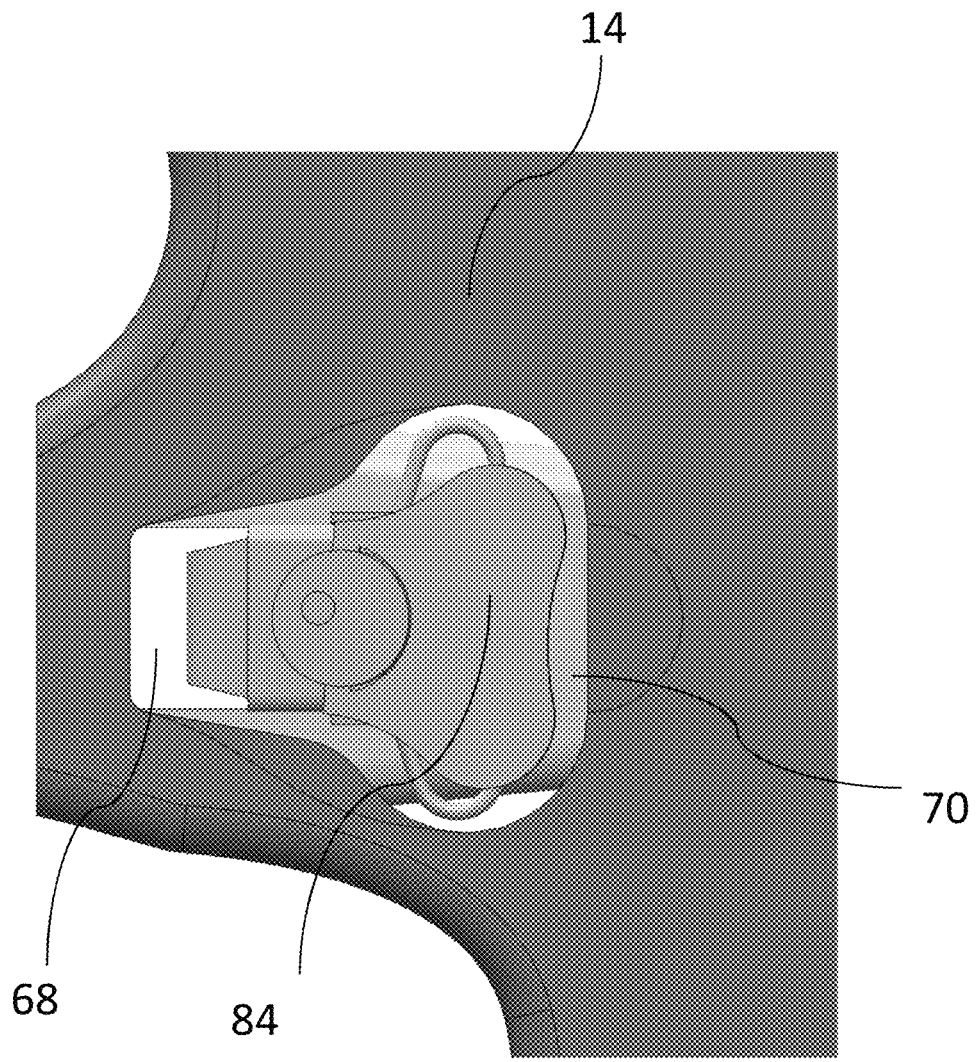
FIG. 30 is a partial bottom view of the outer latch bracket positioned in the instrument body.

As shown in FIG. 30, instrument body 14 includes a toggle hole 68 that enables a person to rotate rotating handle 84 on the back side of instrument body 14. Outer bracket 70 is couples to instrument body 14 with at least one screw on the front side of instrument body 14, as also shown in FIG. 28.

Figure 23F:
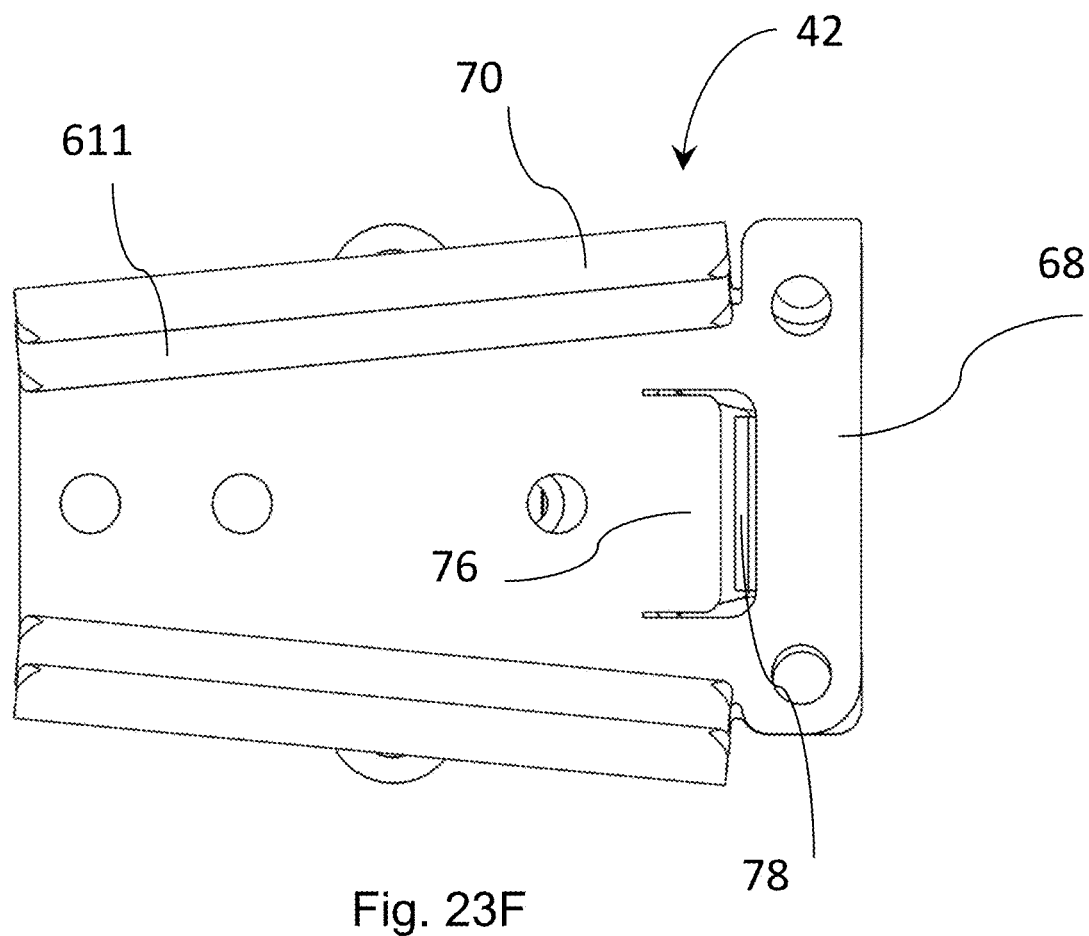
FIG. 23F is a top perspective view of the inner and outer latch bracket attached together.

As shown in FIGS. 23F, 23B, and 23D, inner bracket 68 is nested inside outer bracket 70 when aligned. As discussed above, bracket hook 78 hooks onto bracket tail 76. After this hooking is complete, handle 84 can be rotated to rest flat on the back of outer bracket 70.

Figure 22A:
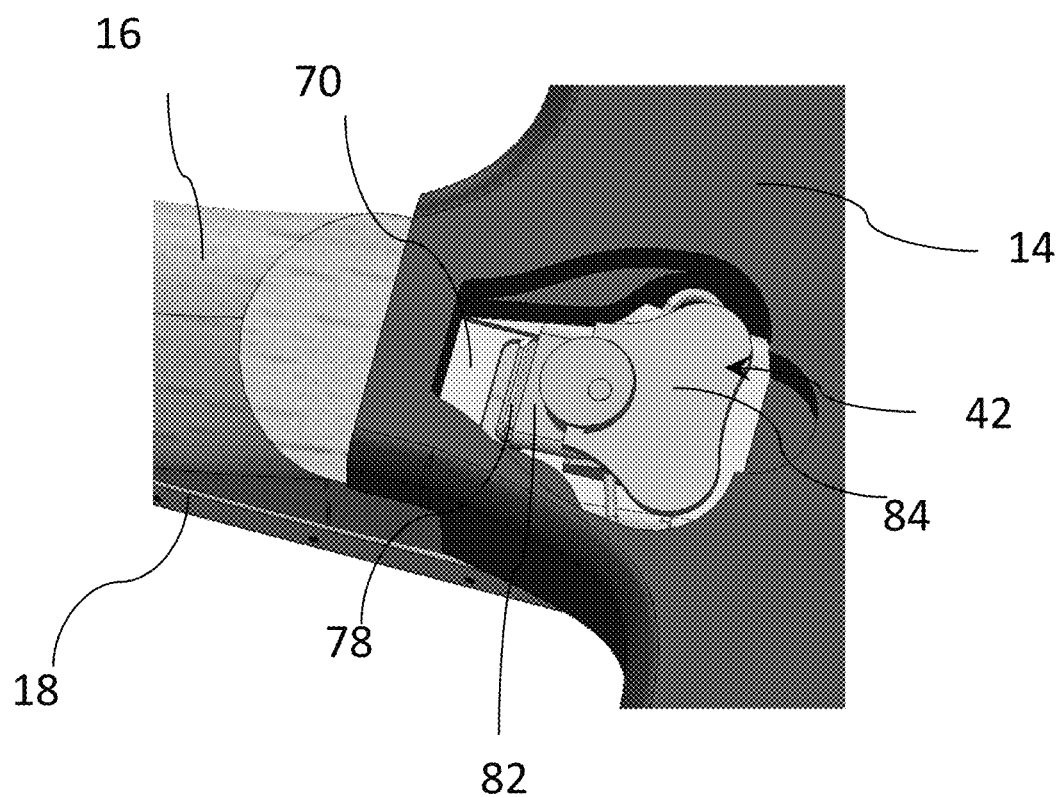
FIG. 22A is a partial perspective view of a latch attaching the neck body to the instrument body.
Figure 22B:
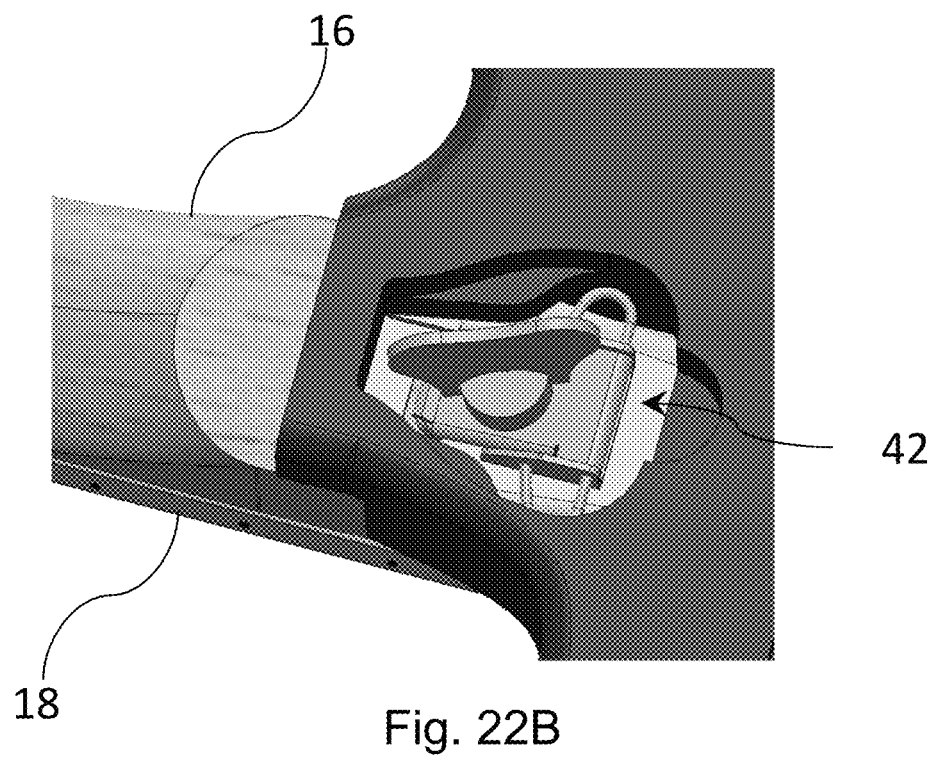
FIG. 22B is a partial perspective view of the latch attaching the neck to the instrument body.
Figure 22C:
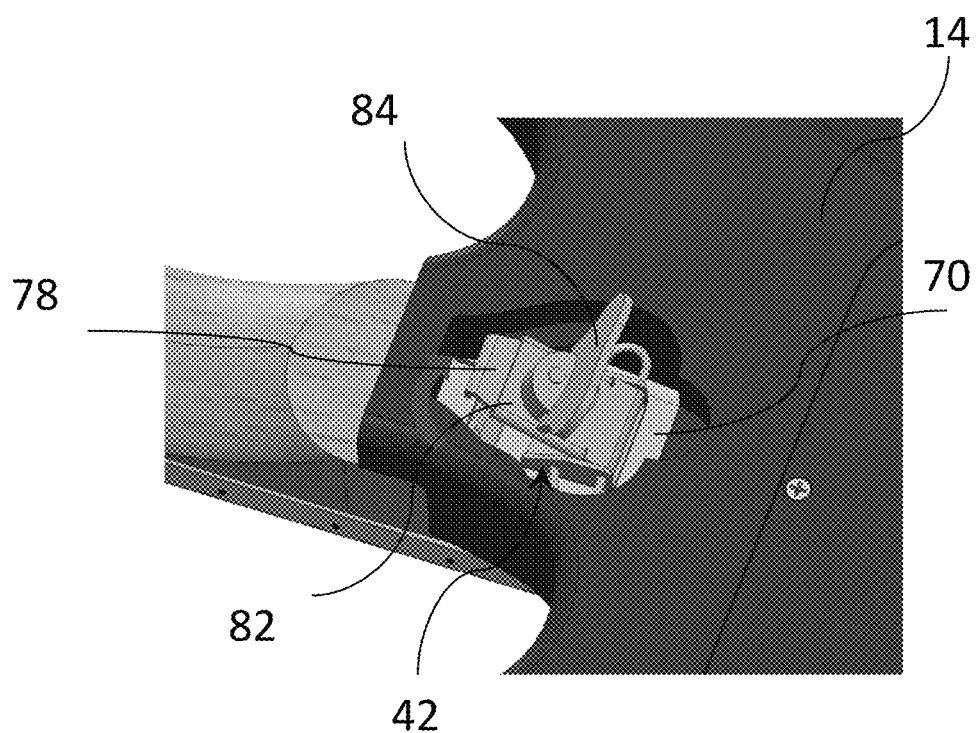
FIG. 22C is a partial perspective view of the neck assembly detached from the instrument body.
Figure 22D:
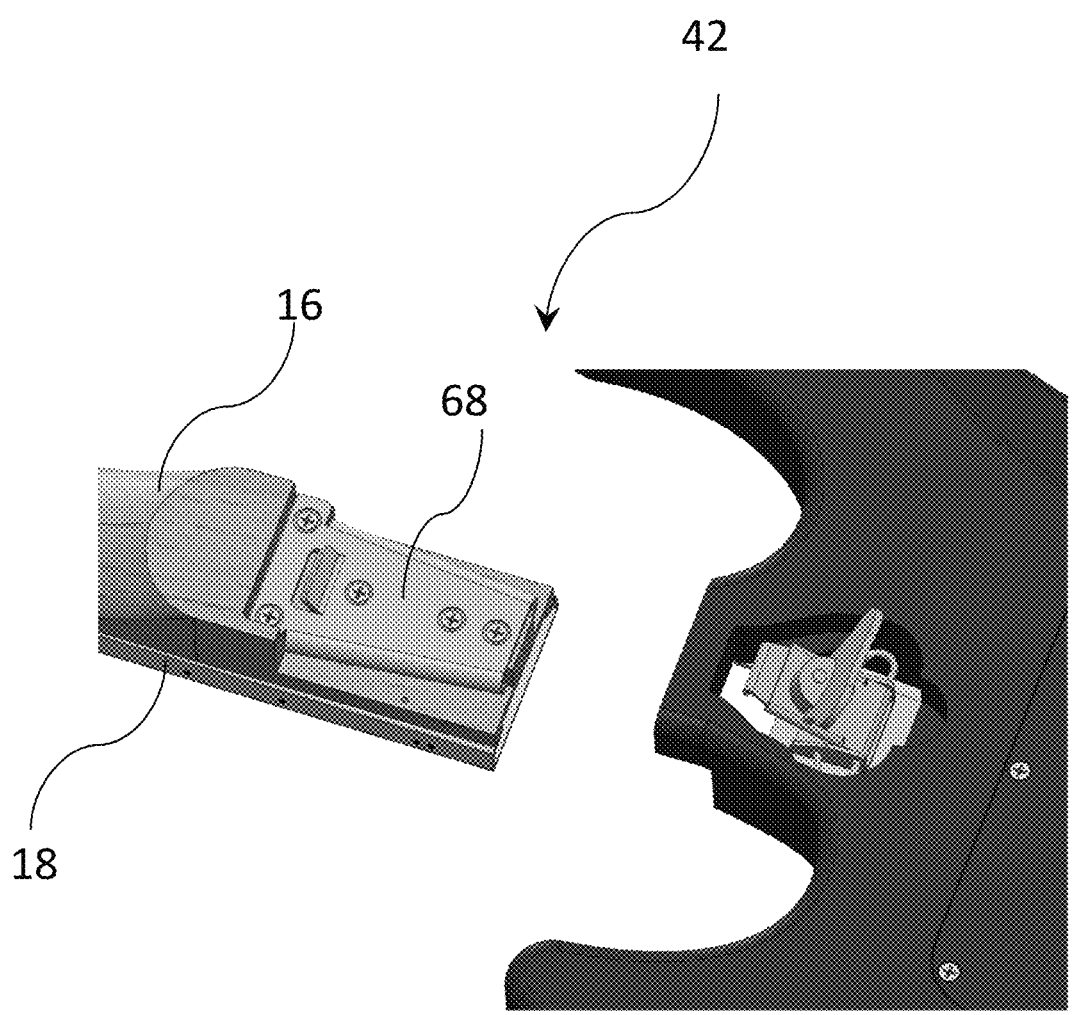
FIG. 22D is a partial perspective view of the inner and outer latch brackets aligned for attachment.

FIGS. 22A-22C demonstrate the process of removing neck body 16 or installing neck body 16 to instrument body 14. Bracket hook 78 can move up and down corresponding to the rotation of rotating handle 84. When latch 42 is at its locking position, inner bracket 68 is nested inside outer bracket 70, as shown in FIGS. 24 and 25. Inner bracket 68 cannot move because bracket hook 78 prevents inner bracket 68 from sliding out of outer bracket 70. To unlock latch 42, handle 84 is rotated to move bracket hook 78 upward; hook holder 82 and bracket hook 78 are lifted up by pulling rotating handle 84 away from instrument body 14. After bracket hook 78 is lifted, inner bracket 68 is able to slide away from outer bracket 70. A person can install neck body 16 to instrument body 14 by reversing the steps described above.

As shown in FIGS. 24-28, instrument body 14 of instrument 10 has another communication port 62. As mentioned above, communication port 62 has cartridge connector slot 64 that receives cartridge connector 66 of second circuit board 60 (as shown in FIG. 25). When latch 42 is in its locking position, communication port 62 on instrument body 14 connects to cartridge connector 66 on one side for first circuit board 58. Therefore, circuitry (not shown) in instrument body 14 can receive the processed signals (or even unprocessed signals) from communication port 62 and synthesize the signal to provide signal indicating the sound of instrument 10.

What is claimed is:
1. A musical instrument, comprising:
   a neck assembly including a neck box defining a region and a neck body at least partially positioned in the region and coupled to the neck box, the neck assembly being devoid of visible fasteners;
   a fastener coupling the neck box to the neck body; and
   an instrument body covering the fastener.
2. The musical instrument of claim 1, further comprising
   a circuit board assembly supported by the neck assembly and
   a plurality of buttons, the circuit board assembly including a plurality of sensors positioned to detect the position of the buttons, the circuit board assembly being configured to detect a status of the sensors and communicate signals indicative of the status of the sensors.
3. The musical instrument of claim 1, further comprising an electronic display supported by the instrument body.
4. The musical instrument of claim 1, wherein the neck box includes at least two spaced apart rails extending along a longitudinal axis of the neck body.
5. The musical instrument of claim 1, further comprising a headstock coupled to the neck body opposite to the instrument body, wherein the neck box includes at least one extension and the headstock includes at least one aperture that receives the at least one extension.
6. The musical instrument of claim 1, further comprising a latch configured to removably attach the neck assembly to the instrument body.

7. The musical instrument of claim 1, wherein the fastener is positioned in a transverse orientation relative to a longitudinal axis of the neck assembly.

8. The musical instrument of claim 1, wherein the neck assembly has a length extending in a direction of a longitudinal axis of the neck assembly and a width perpendicular to the longitudinal axis and the instrument body has a maximum width transverse to the longitudinal axis, and the maximum width of the instrument body is substantially greater than the width of the neck assembly.

9. A musical instrument, comprising:
a neck assembly including a plurality of user input buttons and a circuit board assembly supported by the neck assembly, the circuit board assembly including a first circuit board positioned to detect a status of the plurality of user input buttons,
an instrument body configured to be removably attached to the neck assembly;
an electronic display supported by the instrument body, and
a cartridge connector pair positioned between the first circuit board and the instrument body to transmit information from the first circuit board indicating the status of the plurality of user input buttons to the electronic display when the instrument body is attached to the neck assembly.

10. The musical instrument of claim 9, the cartridge connector pair includes a male connection and a female connection to receive the male connection.

11. The musical instrument of claim 9, wherein the cartridge connector pair includes a first connector and a second connector, wherein the first connector and second connector are spaced apart when the instrument body and the neck assembly are detached.

12. The musical instrument of claim 9, further comprising a latch configured to secure the instrument body to the neck assembly when the instrument body is attached to the neck assembly.

13. A musical instrument, comprising:
a neck assembly including
a neck body, and
a plurality of user input buttons supported by the neck body, and
a circuit board assembly including a first circuit board positioned to detect the status of the plurality of user input buttons; and
an instrument body, the circuit board assembly being configured to communicate information regarding the status of the plurality of user input buttons to the instrument body,
a tactile stiffness of the at least one of the plurality of user input buttons being adjustable.

14. The musical instrument of claim 13, further comprising a flexible film positioned between at least one of the plurality of user input buttons and the first circuit board.

15. The musical instrument of claim 14, wherein at least one of the plurality of user input buttons has at least one concavity configured to receive at least one protrusion of the flexible film.

16. The musical instrument of 13, wherein the neck assembly further comprises at least one screw urging the circuit board assembly into position and rotation of the at least one screw adjusts a tactile stiffness of at least one of the plurality of user input buttons.

17. The musical instrument of claim 9, wherein the instrument body is configured to be removably attached to the neck assembly without the use of tools.

18. The musical instrument of claim 9, wherein at least one of the first circuit board and the instrument body supports a cartridge connector of the cartridge connector pair.

19. The musical instrument of claim 9, wherein the cartridge connector pair includes at least one has at least one communication port.

* * * * *